United States Patent
Harrison et al.

(10) Patent No.: US 8,203,418 B2
(45) Date of Patent: Jun. 19, 2012

(54) MANUFACTURE AND USE OF PLANAR EMBEDDED MAGNETICS AS DISCRETE COMPONENTS AND IN INTEGRATED CONNECTORS

(75) Inventors: William Lee Harrison, El Dorado Hills, CA (US); Anh-Vu Pham, West Sacramento, CA (US); James E. Quilici, El Dorado Hills, CA (US); Sidharth Dalmia, West Sacramento, CA (US); Steven R. Kubes, El Dorado Hills, CA (US)

(73) Assignee: PlanarMag, Inc., West Sacramento, CA (US)

( * ) Notice: Subject to any disclaimer, the term of this patent is extended or adjusted under 35 U.S.C. 154(b) by 0 days.

(21) Appl. No.: 12/592,771

(22) Filed: Dec. 1, 2009

(65) Prior Publication Data
US 2010/0295646 A1  Nov. 25, 2010

Related U.S. Application Data

(63) Continuation-in-part of application No. 12/006,822, filed on Jan. 4, 2008, now Pat. No. 7,821,374.

(60) Provisional application No. 60/880,208, filed on Jan. 11, 2007, provisional application No. 61/200,809, filed on Dec. 3, 2008, provisional application No. 61/204,178, filed on Dec. 31, 2008.

(51) Int. Cl.
*H01F 5/00* (2006.01)
*H01F 27/29* (2006.01)
*H01F 27/28* (2006.01)

(52) U.S. Cl. ......... 336/200; 336/192; 336/229; 336/232

(58) Field of Classification Search .................. 336/192, 336/200, 229, 232
See application file for complete search history.

(56) References Cited

U.S. PATENT DOCUMENTS

| | | | | |
|---|---|---|---|---|
| 2,909,733 A | * | 10/1959 | Walter | 333/119 |
| 3,168,715 A | * | 2/1965 | Woodworth | 333/119 |
| 3,374,452 A | * | 3/1968 | Judd | 336/60 |
| 3,453,574 A | | 7/1969 | Parry | |
| 3,486,149 A | * | 12/1969 | Klein | 336/192 |
| 3,517,268 A | * | 6/1970 | Hudspeth | 329/326 |

(Continued)

FOREIGN PATENT DOCUMENTS
WO      WO 97/08788      3/1997
(Continued)

*Primary Examiner* — Elvin G Enad
*Assistant Examiner* — Tsz Chan
(74) *Attorney, Agent, or Firm* — Lumen Patent Firm

(57) ABSTRACT

The current invention provides an integrated planar transformer and electronic component that includes at least one wideband planar transformer disposed in a planar substrate, where each wideband planar transformer includes a planar substrate in a fully-cured and rigid state, a ferrite material embedded in the planar substrate, where the ferrite material is enveloped in an elastic and non-conductive material, inter-wound conductors disposed around the embedded ferrite material, where top and bottom conductors are bonded by an insulating adhesive. The top and bottom conductors are connected in an inter-connected pattern by conductive vias disposed on each side of the ferrite material and span through the layers to the conductors. The planar transformer further includes at least one center tap connected to at least one inter-wound conductor. The integrated planar transformer and electronic component further includes at least one electronic component connected to at least one terminal of the wide-band planar transformer.

38 Claims, 25 Drawing Sheets

U.S. PATENT DOCUMENTS

| | | | |
|---|---|---|---|
| 3,553,584 A * | 1/1971 | Walsh, Jr. | 455/20 |
| 3,731,237 A | 5/1973 | Beurrier | |
| 3,881,244 A | 5/1975 | Kendall | |
| 4,767,355 A | 8/1988 | Phillipson et al. | |
| 4,777,465 A * | 10/1988 | Meinel | 336/65 |
| 4,824,383 A | 4/1989 | Lemke | |
| 5,169,324 A | 12/1992 | Lemke et al. | |
| 5,191,699 A * | 3/1993 | Ganslmeier et al. | 29/602.1 |
| 5,353,001 A * | 10/1994 | Meinel et al. | 336/83 |
| 5,372,967 A | 12/1994 | Sundaram et al. | |
| 5,420,551 A | 5/1995 | Conte et al. | |
| 5,639,266 A | 6/1997 | Patel | |
| 5,745,981 A | 5/1998 | Roshen et al. | |
| 5,781,091 A | 7/1998 | Krone et al. | |
| 5,825,259 A | 10/1998 | Harpham | |
| 5,879,194 A | 3/1999 | Thenaisie et al. | |
| 5,959,846 A * | 9/1999 | Noguchi et al. | 361/782 |
| 6,036,550 A | 3/2000 | Naganawa et al. | |
| 6,065,991 A | 5/2000 | Fukuda | |
| 6,102,741 A * | 8/2000 | Boutros et al. | 439/620.06 |
| 6,139,350 A | 10/2000 | Mathesius | |
| 6,148,500 A | 11/2000 | Krone et al. | |
| 6,176,741 B1 | 1/2001 | Shutter | |
| 6,267,628 B1 | 7/2001 | Meckley et al. | |
| 6,324,067 B1 | 11/2001 | Nishiyama | |
| 6,419,526 B1 | 7/2002 | Fair et al. | |
| 6,535,085 B2 | 3/2003 | Song et al. | |
| 6,540,563 B1 | 4/2003 | Hu et al. | |
| 6,554,368 B2 | 4/2003 | Drake et al. | |
| 6,579,127 B2 | 6/2003 | Hess et al. | |
| 6,583,705 B2 | 6/2003 | Schutten et al. | |
| 6,593,836 B1 | 7/2003 | LaFleur et al. | |
| 6,603,383 B2 * | 8/2003 | Gevorgian et al. | 336/200 |
| 6,686,824 B1 | 2/2004 | Yamamoto | |
| 6,749,467 B2 | 6/2004 | Korsunsky et al. | |
| 6,768,409 B2 | 7/2004 | Inoue et al. | |
| 6,769,936 B2 | 8/2004 | Gutierrez et al. | |
| 6,773,302 B2 * | 8/2004 | Gutierrez et al. | 439/541.5 |
| 6,873,239 B2 | 3/2005 | Decristofaro et al. | |
| 6,878,012 B2 | 4/2005 | Gutierrez et al. | |
| 6,940,385 B2 | 9/2005 | Kusano | |
| 6,964,585 B2 | 11/2005 | Blichasz et al. | |
| 7,005,955 B2 | 2/2006 | Schumacher | |
| 7,196,607 B2 | 3/2007 | Pleskach et al. | |
| 7,295,448 B2 | 11/2007 | Zhu | |
| 7,297,013 B2 | 11/2007 | Caveney et al. | |
| 7,436,282 B2 | 10/2008 | Whittaker et al. | |
| 7,477,128 B2 | 1/2009 | Quilici | |
| 2003/0005569 A1 * | 1/2003 | Hiatt et al. | 29/602.1 |
| 2003/0011458 A1 * | 1/2003 | Nuytkens et al. | 336/200 |
| 2004/0113738 A1 | 6/2004 | Ahn et al. | |
| 2004/0135662 A1 * | 7/2004 | Harding | 336/229 |
| 2004/0150502 A1 | 8/2004 | Jacobson et al. | |
| 2006/0009061 A1 * | 1/2006 | Machado et al. | 439/215 |
| 2006/0081397 A1 * | 4/2006 | Enchi et al. | 174/260 |
| 2006/0125586 A1 | 6/2006 | Lee et al. | |
| 2006/0152322 A1 * | 7/2006 | Whittaker et al. | 336/200 |
| 2007/0111598 A1 | 5/2007 | Quilici | |
| 2007/0159282 A1 | 7/2007 | Huang et al. | |
| 2008/0007380 A1 * | 1/2008 | Snyder | 336/180 |
| 2008/0094153 A1 * | 4/2008 | Wang et al. | 333/177 |
| 2008/0179963 A1 * | 7/2008 | Fouquet et al. | 307/104 |
| 2008/0186119 A1 | 8/2008 | Zou | |
| 2009/0077791 A1 | 3/2009 | Quilici | |

FOREIGN PATENT DOCUMENTS

| | | |
|---|---|---|
| WO | WO 2005-099280 | 10/2005 |
| WO | WO 2006-063081 | 6/2006 |

* cited by examiner (a)

(i)        (ii)        (iii)

(iv)

(c)

(b)

MANUFACTURE AND USE OF PLANAR EMBEDDED MAGNETICS AS DISCRETE COMPONENTS AND IN INTEGRATED CONNECTORS

CROSS-REFERENCE TO RELATED APPLICATIONS

This application is a continuation in part to and claims the benefit from U.S. patent application Ser. No. 12/006,822 filed Jan. 4, 2008 now U.S. Pat. No. 7,821,374 which claims benefit from U.S. provisional application 60/880,208 filed Jan. 11, 2007, and this application also claims benefit from U.S. Provisional Application 61/200,809 filed Dec. 3, 2008, and from U.S. Provisional Application 61/204,178 filed Dec. 31, 2008, which are hereby incorporated by reference.

FIELD OF THE INVENTION

The present invention relates generally to communication technologies. More particularly, the invention relates to a method of creating embedded planar magnetic components, and integrating planar magnets into communication connectors.

BACKGROUND

Connectors have been used in the communications industry since it was originally developed for voice traffic. Connectors have gone through a number of evolutions so that it can support current 10G/1G/100/10 Mbps Ethernet. This technology will continue to evolve to support emerging high-speed 40G and 100G, along with other communication protocols and electronic equipment requiring electromagnetic components. As communication systems have begun to aggregate more and more individual ports in one box (i.e. 48 port Ethernet switches or multi-port routers), printed circuit board space has become very valuable. The connector manufacturers took the next step in the connector evolution by attempting to integrate external magnetics into the connector in order to reduce the system footprint, in addition to adding printed circuit boards with passive components to match parasitics from the integrated circuits (ICs) and connectors. The magnetics are required for isolating the user from internal voltage surges, or the electronics from external high voltage shorts and surges. They also limit the EMI electro magnetic interference emissions seen emanating from the system that is essential in compliance to rules and regulations associated with electronic equipment.

In current solutions, hand wound magnetics are integrated into the connector housing by soldering down these hand wound components onto posts or pads provided in the back of the RJ-45. In single jack housings, eight of these individually wound magnetic units needed to be attached to the proper connections and then squeezed into the back of the housing. Shown in FIGS. 1(a)-(b) are prior art components 100, where FIG. 1(a) shows hand-wound wires 102 wrapped around an annulus-shaped or toroid magnet 104, forming a magnetic unit 106, and FIG. 1(b) shows conventional connectors 108 and the difficulty in accomplishing this integration. Once all the magnetic units 106 are inserted they are covered with a gel material to hold them in place. This is time consuming and offers poor repeatability and performance since the magnetic units 106 are in close proximity and their spacing is difficult to control. Some efforts have been made to delineate the position of these units using guideposts or grooves in the housing but these have fallen into disuse due to cost and manufacturing cycle times. Controlling leakage and balancing primary and secondary turns across center tap is virtually impossible with these hand wound parts. Furthermore for higher frequency application it is not possible to control impedance and achieve wideband performance. Finally these components cannot be used to create subsystems and modules because of the inherent variations from hand winding.

In other assemblies, a horizontal donor PCB board can be inserted into the housing, which allows the manufacturer to place passives and the magnetics on the PCB where it again will be restrained with potting material. While this offers an improvement over other attempts it still offers limited performance since the magnetics are still hand wound and then placed, which limits performance and increases manufacturing cost. These boards also provide one other function, which is to provide a base for the connector.

OEM's (original equipment manufacturers) are now beginning to look at how to get to the next level of integration in their equipment. They would like to move to 96 port face plates on their boxes which means that the connectors and PCB space must get much more compact. Connectors (not RJ45 connectors) must get narrower and not go as deep as current designs offer. The current hand wound magnetic solutions do not satisfy this need due to mechanical constraints and hand assembly.

Currently transformer magnetics are hand wound, then epoxy-glopped and packaged. They are typically Quad Flat No leads (QFN), Gull wing or Ball Grid Array (BGA) packages. These hand wound components are used in non-Ethernet applications such as set top boxes, RF routers, RF mobile, internet and consumer electronics. When these hand wound transformers are integrated into a connector they may go onto a PCB substrate and be mounted in horizontal or vertical configurations. These are hand wound and hand soldered, attached to a thin printed circuit board and then attached inside of the connector. Critical parasitic parameters cannot be controlled such as leakage inductances and capacitive coupling this causes poor performance.

Accordingly, there is a need to develop low-cost, embedded planar magnetic components that are integrated into narrow and shallow communication connectors. There is a further need for an efficient and low-cost method of manufacturing such devices that eliminates damage to the ferrite material and reduces EMI, maximize the winding turns and controlling the winding parasitic inductance.

SUMMARY OF THE INVENTION

The current invention provides an integrated planar transformer and electronic component that includes at least one wideband planar transformer disposed in a planar substrate, where each wideband planar transformer includes a planar substrate, where the planar substrate is in a fully-cured and rigid state, a ferrite material embedded in the fully-cured and rigid planar substrate, where the embedding includes the ferrite material enveloped in an elastic and non-conductive material. The planar transformer further includes inter-wound conductors disposed around the embedded ferrite material, where the inter-wound conductors have top conductors bonded to a top surface of the fully-cured and rigid substrate by a first bonding layer and bottom conductors bonded to a bottom surface of the fully-cured and rigid substrate by a second bonding layer, where the bonding layers include an insulating adhesive. The top and bottom conductors are connected in an inter-connected pattern by conductive vias disposed on each side of the ferrite material, where the conductive vias span through the bonding layers and through the fully-cured and rigid planar substrate forming the inter-wound conductors. The planar transformer further includes at least one center tap connected to at least one inter-wound conductor. The integrated planar transformer and electronic component further includes at least one electronic component, where the electronic component is connected to at least one terminal of the wide-band planar transformer.

According to one aspect of the invention, the planar substrate can include FR4, thermoset or thermoplastic.

In another aspect of the invention, the adjacent top conductors are disposed to conform to a parallel and predetermined spacing there between and the adjacent top conductors and bottom conductors are disposed to maximize a number of the windings around the embedded ferrite material to lower a winding parasitic inductance and leakage inductance. Here, the spacing between the top conductors and bottom conductors can be in a range of 10 µm to 500 µm.

In a further aspect of the invention, the conductive layers are laminated to the planar substrate using laminate materials that can include a flexible epoxy, high temperature thermoplastics, or high flow ceramic filled hydrocarbon.

According to another aspect, the center taps are impedance-matched to 50% of the differential impedance, where any non-differential current follows the center tap to a ground or can be left open, terminated with electrical network to optimize the impedance matching or filtering of common mode signals.

In yet another aspect of the invention, the ferrite material has a shape that can include an annulus, toroid, U-shape, E-shape or bar. Here, a center of the annulus-shape ferrite material or the toroid-shape ferrite material includes a dimensionally stable potting compound disposed therein. Further, a center of the annulus-shape ferrite material or the toroid-shape ferrite material includes a thermoplastic element disposed therein, where the thermoplastic element has material properties that match the material properties of the planar substrate and a shape that matches the shape of the annulus center or the toroid center.

According to another aspect, a breakdown material is disposed across at least two terminals of the wideband planar transformer, where the breakdown material actuates when exposed to a potential in a range of 500V rms to 10,000V rms.

In yet another aspect, all external surfaces of the integrated planar transformer are coated with an insulating layer, where at least one terminal of said integrated planar transformer is exposed.

According to one aspect of the invention, connections between the wideband planar transformer and the electronic component include at least one electrically conductive pin disposed through at least one hole in the substrate, where the at least one electrically conductive pin is linear or angled.

In a further aspect, the top conductors include a teardrop-shape, where a narrow end of the teardrop-shape is connected to an inner conductive element disposed in a center of an annulus-shaped or toroid-shaped of the ferrite material and a broad end of the teardrop-shape is connected to an outer conductive element disposed around an outside of the annulus-shaped or toroid-shaped the ferrite material. Here, transformer inductors are coupled with a coupling coefficient between 0 to 1, where the coupling is according to i) a spacing between the conductive elements, or ii) a spacing between the teardrop-shape conductors, or iii) an open span in the annulus or the toroid ferrite, or iv) according to a ratio of primary and secondary the inter-windings, or i), ii), iii) and iv), where the open span includes an air gap, where the air gap may include at least one ground via.

In another aspect of the invention the electronic component can be any connector requiring isolation or electromagnetic functionality. Here, the connector includes at least one electrical contact connected to at least one terminal of the planar transformer.

In one aspect of the invention, at least one wideband planar transformer includes an array of the wideband planar transformers.

In a further aspect of the invention, at least one electronic component includes an array of the connectors.

In another aspect of the invention, the at least one electronic component includes an array of PCB's.

According to another aspect, a bottom surface of the integrated planar transformer and electronic component include solder pads.

In yet another aspect, thermal conduits are disposed to extract heat generated at the inter-wound conductors. Here, the thermal conduits can include heat conductive metal plated vias, at least one heat conductive metal layer, additional heat conductive metal disposed on at least one signal trace, at least one heat conductive tab disposed at an edge of the integrated planar transformer device, or a heat conductive material around the edge of the integrated planar transformer and electronic component.

In a further aspect, the at least one center tap is disposed on top of the wideband planar transformer.

According to another aspect, the electronic component is disposed on top of the planar substrate to minimize a distance there between to providing a desired match for a center tap current.

In another aspect of the invention, the wideband planar transformer further includes i) at least one common mode choke, where each common mode choke provides signal shaping and condition, or ii) M-circuits, or i) and ii), where the M-Circuits are electrical circuitry supporting functionalities of the embedded wideband planar transformer for specific functions and applications. Here, the functionalities supported by the M-Circuits can include filter functions, cross talk cancellation functions, high voltage suppression, EMI suppression, digital controls, LED controls, Balun controls and power management functionality.

In a further aspect, the integration includes stacking, where the stacking includes at least a first wideband planar transformer and a first choke on top of a second wideband planar transformer and a second choke and a filter and impedance matching element on top of the first wideband planar transformer and the first choke, where the number of the wideband planar transformers in the stack is according to a desired application.

According to yet another aspect of the invention, the integration comprises stacking, wherein the stacking includes a choke on top of a filter, where the filter is disposed on top of an impedance matching element and the impedance matching element is disposed on the wideband planar transformer.

In a further aspect of the invention, the elastic and non-conductive material includes at least one filler, where the elastic and non-conductive material with the filler have a coefficient of thermal expansion up to a coefficient of thermal expansion of the planar substrate.

In yet another aspect of the invention, drill holes are provided in the substrate, where a thermal expansion of the integrated planar transformer and electronic component is controlled by the drilled holes.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

Figure 2:
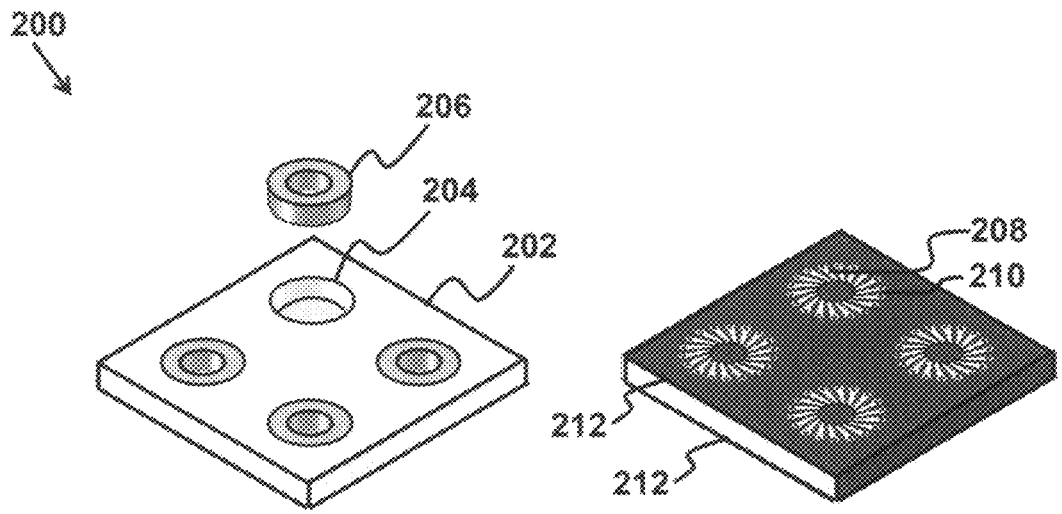
FIGS. 2(a)-(e) show the planar transformers provided into compact arrays, according to the present invention.
Figure 2:
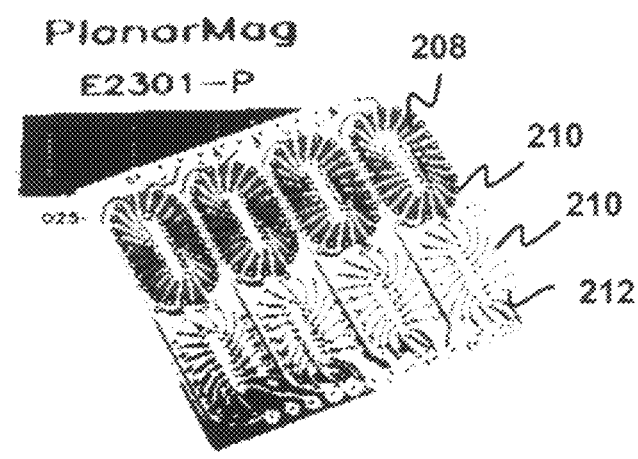
Figure 2:
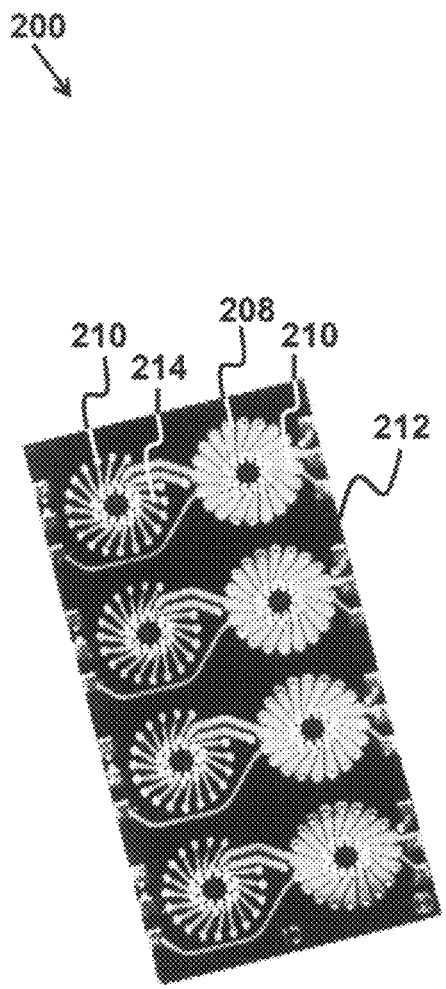
Figure 2:
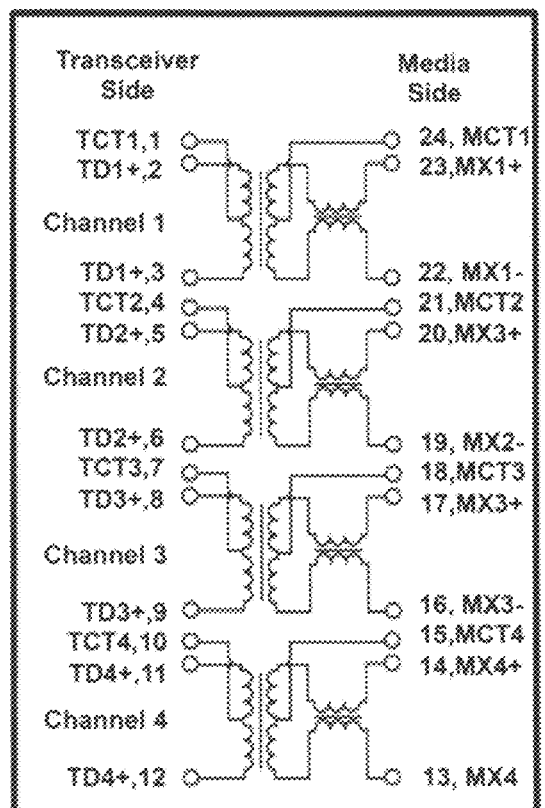

The current invention includes planar magnetics in which the ferrites or magnets are embedded as a component into a base dielectric material having pre-formed openings, where the pre-formed openings can be molded, routed mechanical drilled, or punched for the magnetic (ferrites) units. These are then encapsulated in a low-stress adhesive, such as a low-stress epoxy, disposed to provide a proper electrical environment. Layers of copper in conjunction with vias enable a magnetic structure, previously created by hand winding units, in a small component similar to an IC. These units can be created for individual channels or in groups of channels. FIGS. 2(a)-(e) show planar transformers 200 disposed in arrays, where FIG. 2a shows a planar substrate 202 that is in a fully-cured and rigid state. The planar substrate 202 is shown having pockets 204, shown here as round holes for example, with precise tolerances for receiving the ferrite material 206, shown here as an annulus for example. The holes can be drilled through or with a controlled depth to a desired thickness. FIG. 2(b) shows an array of planar transformers 200 with top conductors 208 formed in a teardrop-shape, where also shown are conductive vias 210 disposed on the inside and outside edges of the annulus-shaped ferrite in FIG. 2(a). Further shown in FIG. 2(b) are the top conductors 210 bonded to the planar substrate 202 using an insulating adhesive 212, where further shown is the insulating adhesive 212 disposed on the bottom surface of the planar substrate 202 for bonding the bottom conductors 214 as shown in FIG. 2(c). Here, FIG. 2(c) shows an array of oval-shaped planar transformers 200 with the top conductors 208 shown having non-uniform teardrop-shapes as the conductors wrap around the embedded ferrite 206. As shown, the teardrop-shaped top conductors 208 are arranged to conform to a parallel and predetermined spacing there between and the adjacent top conductors 208 and are disposed to maximize a number of the windings around the embedded ferrite material 206 to lower a winding parasitic inductance and leakage inductance.

FIGS. 2(d)-(e) show an array of planar transformers 200 an array of planar transformers 200 arranged for a multi-channel application (see FIG. 2(e)), where FIG. 2(d) shows the circular annulus-shape/toroid ferrite 206 is used, and the top conductors 208 are of relatively uniform teardrop-shape having parallel and predetermined spacing there between, as mentioned above.

Figure 3:
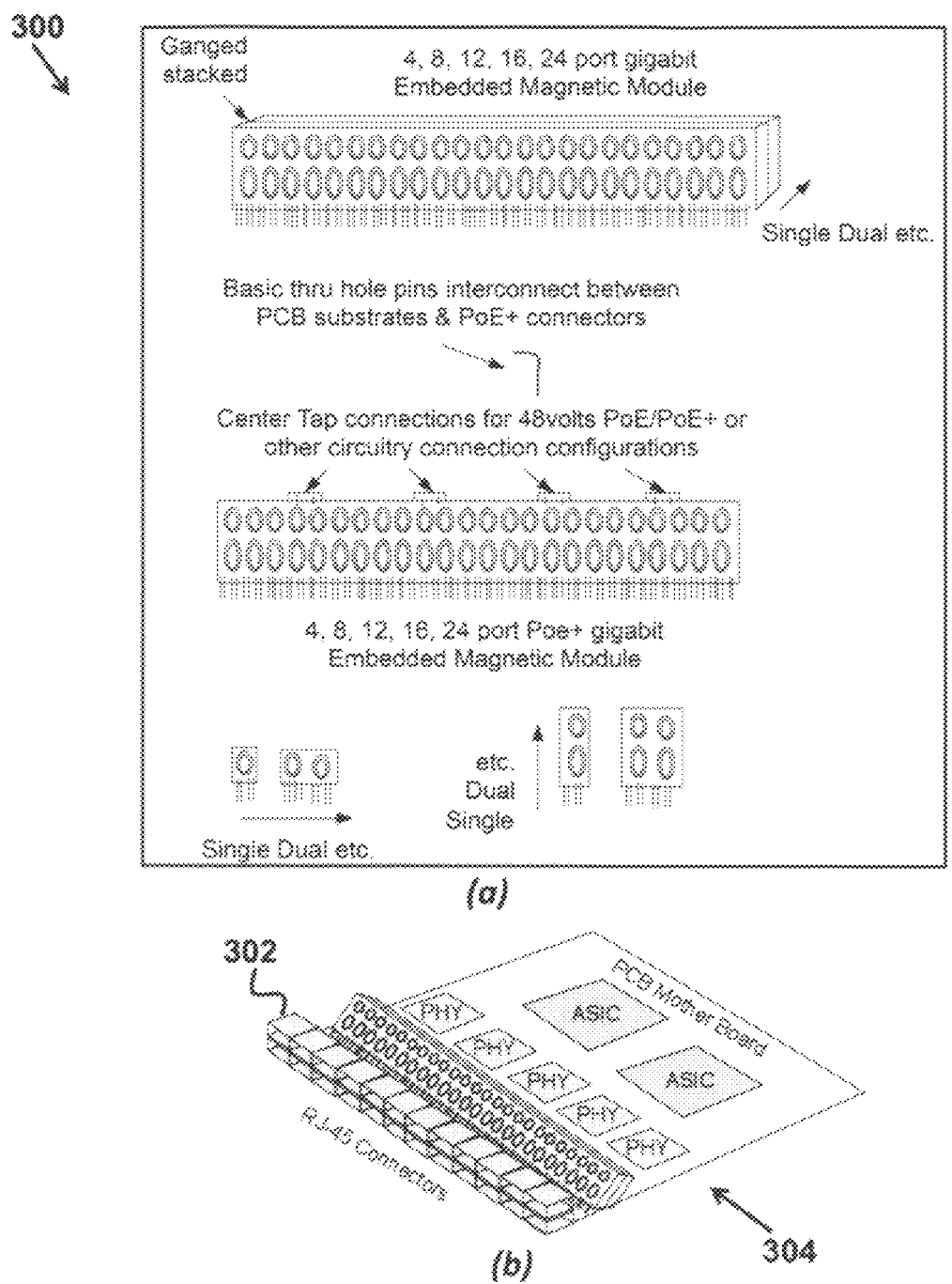
FIGS. 3(a)-(b) show connectors created into compact arrays of units to enable various channel options for the connector manufacturer, according to the present invention.
Figure 17:
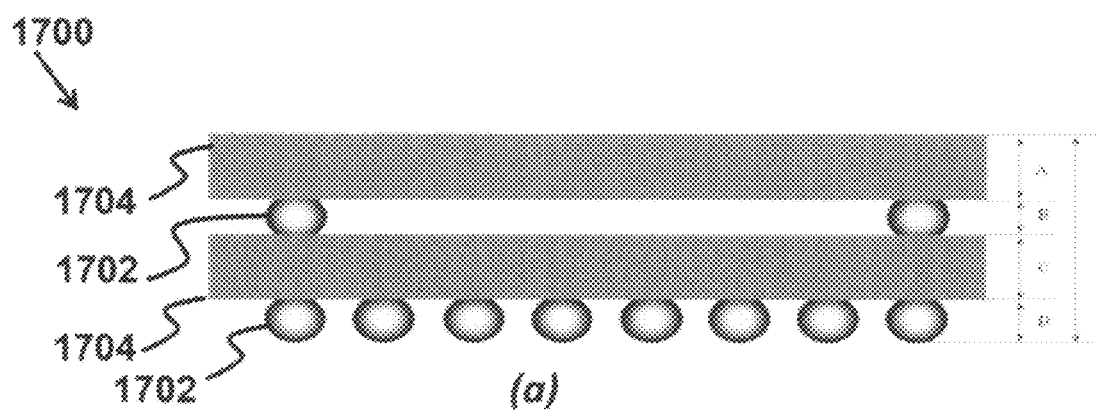
FIGS. 17(a)-(d) show integrated magnetic circuitry with stacked layers and solder balls attached according to the current invention.
Figure 17:
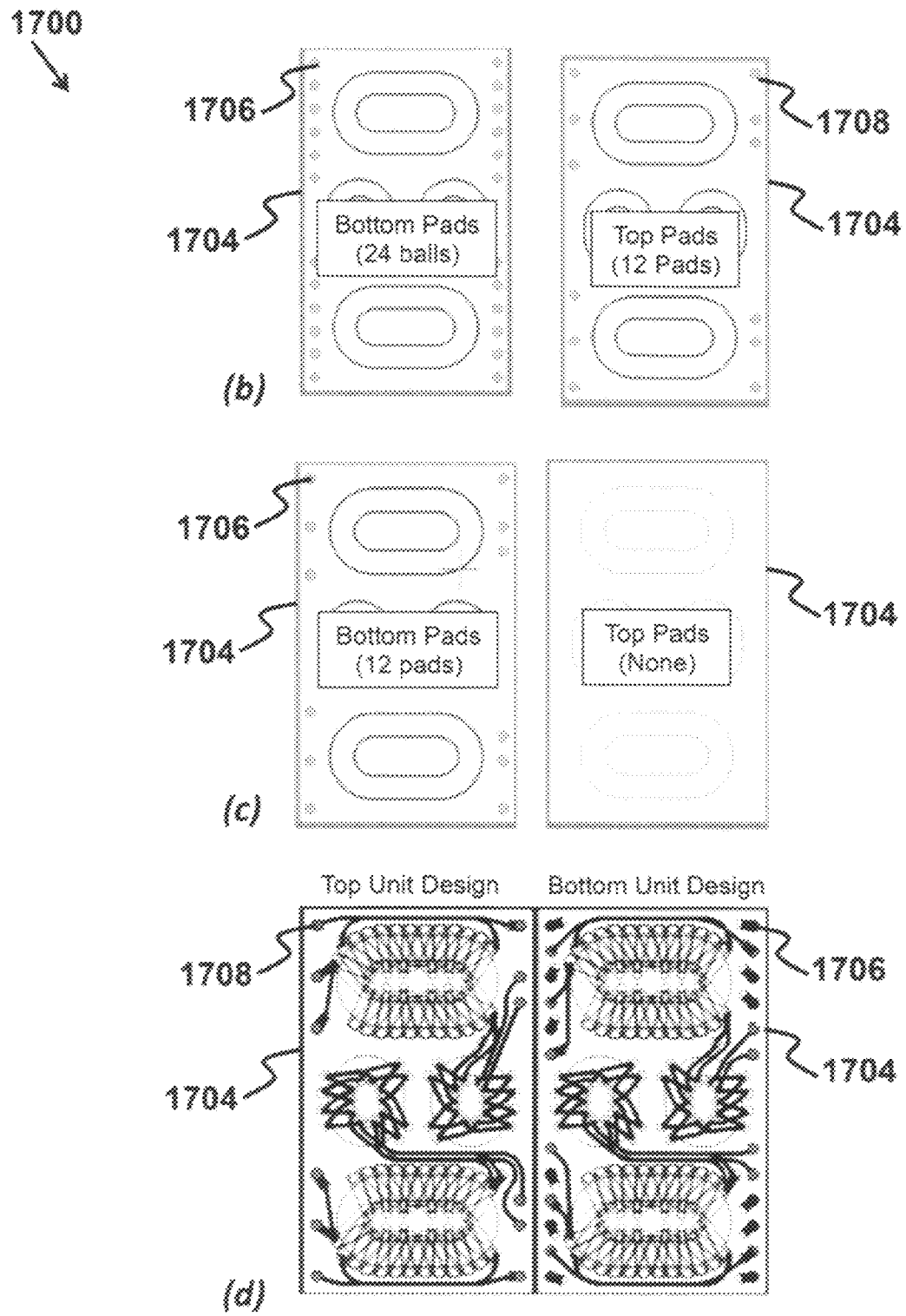

FIGS. 3(a)-(b) show an arrangement of stacked planar transformers 300, for example, the planar transformers 200, can be stacked vertically into the back of the connector 302 (see FIG. 3(b)) to minimizing the space needed to create one integrated connector unit 304. Because many integrated connectors require eight individual wound ferrites or magnetic material shapes to be used, for example covering four signal channels in the connector 302, compact arrays of connectors 304 (i.e. 1×4 units or 2×6 units) from a manufacturer have extended component options due to the compact and durable nature of the planar transformers 202 according to the current invention (see FIG. 17 for stacking details).

An alternative implementation of the current invention adds pads to the bottom of the channel magnetic unit. These pads can be similar to a QFN package or LGA (Leadless Grid Array) that allow the integrated magnetic unit 200 to be reflowed onto pads on the connector or on another PCB substrate. If high temperature solder is used, the connector still has the ability to be reflowed in the OEM's reflow process with no effect on the connector 302. One other aspect can include BGA pads added to the bottom of the magnetic units 200. These also allow the stacking of the channels as needed into the connector.

Connectors in industry not only provide signal paths for the equipment but also provide power for external equipment. The difficulty with using hand wound ferrites in these applications is that it is very difficult to extract heat from the wiring used since it is surrounded by air and low stress potting materials with poor thermal conductivity. The current invention provides extra layers of copper, extra copper plated vias, or thick signal traces that act as thermal conduits extracting heat generated in the windings. In addition, copper or other conductive material can be placed/coated around the edges of the planar device. By adding vias or pads on the edges of board, a connector manufacturer can attach metal tabs to the substrates, which are incorporated as part of the connector housing to provide a heat sink to the substrates for enhanced thermally efficient.

Another issue relating to these connectors includes additional passives required for filtering and EMI control. In order to be effective in carrying away EMI, common mode current center taps are integrated to the wideband planar transformer, according to the current invention. These center taps are impedance-matched to 50% of the differential impedance so that any non-differential current will take this path back to an appropriate ground. The better the impedance match to 50% of the differential impedance than the signal sees, the more current will be drawn off. This leads to fewer emissions. Previous to the current invention, common mode traces often traveled long distances from the magnetics to the appropriate ground. In addition, a slight variation of copper traces can create inductance for optimal common mode rejection and Electro Magnetic Interference (EMI) performance. Furthermore, the invention provides a mechanism for reducing common mode noise that includes using discrete components.

According to the current invention, FIGS. 4(a)-(e) show combined termination resistors and magnetic structures 400, where shown are termination resistors 402 placed directly on top of the magnetic structures 200. This is not possible on the current magnetics used in integrated connectors because the ferrites are hand wound, as shown in. It is understood that other components may be placed directly on the surface of the ferrites embedded in the planar substrate, minimizing this distance and providing a perfect match for the center tap current. This also makes for a much more compact design.

Figure 4:
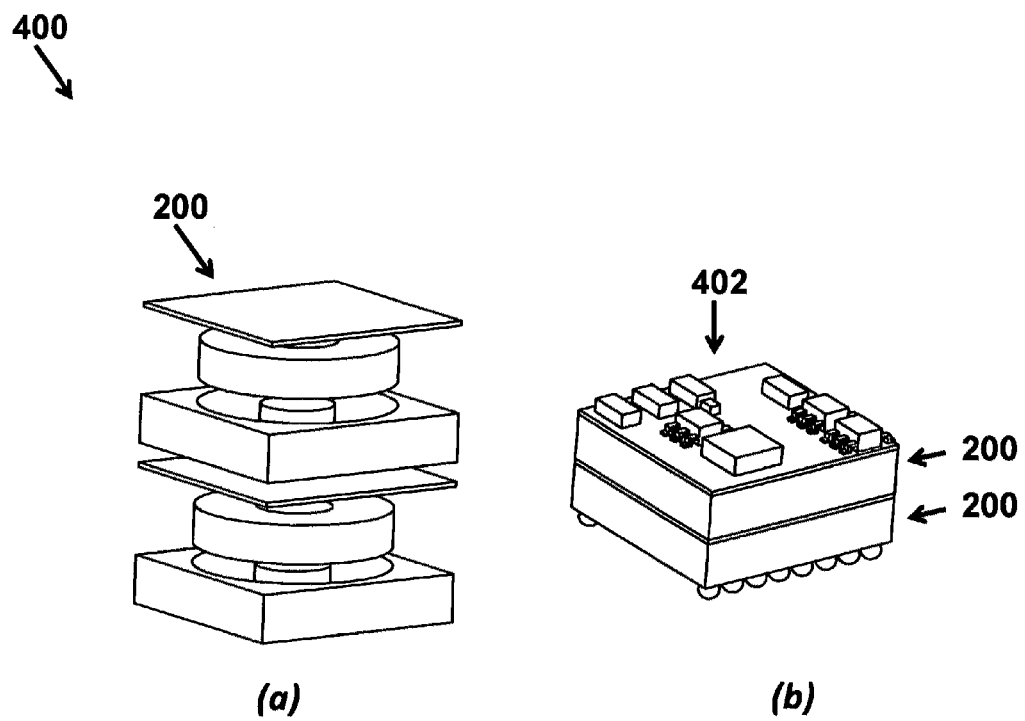
FIGS. 4(a)-(e) show the termination resistors are placed directly on top of the magnetic structures and center tap configurations, according to the present invention.
Figure 4:
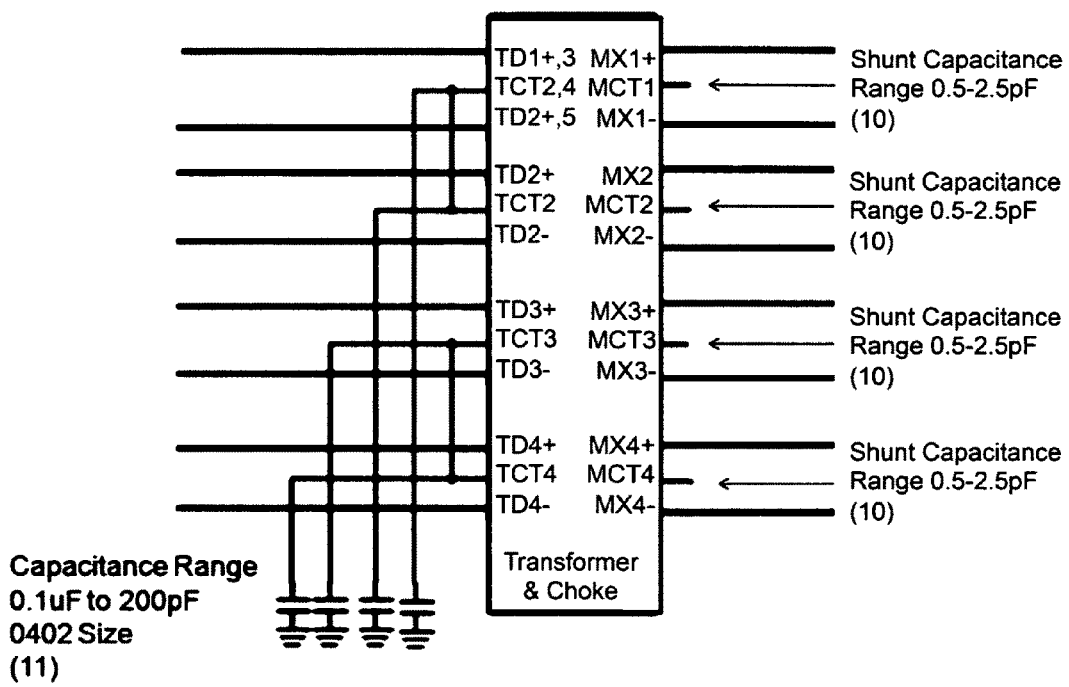
Figure 4:
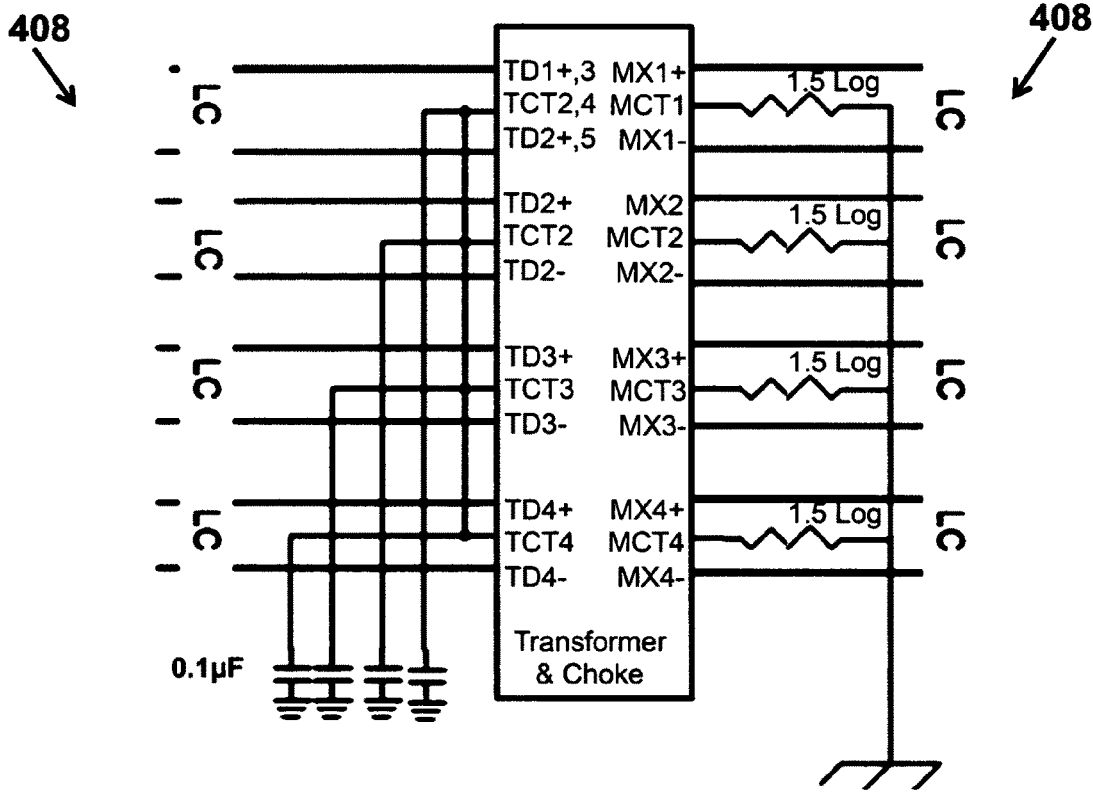

FIG. 4(c) shows a schematic diagram of a center tap termination circuit 404 having the replacement of a resistive termination with a capacitive termination in the range of 0.2-2.5 pF that can be realized using a open stub (non physical components) or inter-digitated fingers or physically surface mount capacitor as item 11. This novel change allows for the well-controlled leakage inductance (L), which is typically controlled and in the range of 1-15uH to resonate in common mode conversion with the capacitor (C) to create a transmission at desired frequencies. More specifically such frequencies are often the first or second harmonic of the clock of the system. It is important to note that the capacitor C is implemented in a fashion that has high dielectric breakdown voltage. This can be implemented as a stub where the ground or shields are reasonable spaced in the presence of dielectrics or air to achieve isolation. The frequency of resonance is determined and inversely proportional to the square root of the product of L and C.

FIG. 4(d) shows a schematic diagram of an enhanced filtering series LC taps 406, where the components in FIG. 4(c) are provided an enhanced rejection in the transmission path at selective frequencies without causing the functionality in the pass band to degrade. This is achieved as shown with the LC traps 408 interposed at the inputs and outputs or between choke and transformer allow for $1^{st}$ order to $n^{th}$ order elliptic low-pass filtering. FIG. 4(e) shows a graph of the response 410 of 2 LC traps added to the top side of transformer and choke combination circuit where the pass band is flat till 600 MHz and dips sharply at desired frequency of 700 MHz-800 MHz where cellular devices and mobile applications tend to radiate and leak energy.

Today's high-speed connectors provide a signal path to signals that are running many hundreds of MHz. They often have to be filtered externally to minimize interference from outside noise sources like Global System for Mobile communications (GSM) phones. In the planar implementation, the external filter and impedance matching to both silicon device and connectors, which may include RJ-45 connectors, can be done in the actual signal path on the embedded planar transformer offering consistently, precise, high performance solutions to users. This also eliminates issues in the PCB board design like the ability to add vias or test points. In the hand-wound solution these are not possible.

Crosstalk between ferrites in these connectors is a critical issue, as the spacing cannot be controlled well with hand wound parts. According to one aspect of the current invention, the spacing is defined by the board lithography, which is controlled very accurately. In the multi-layer stacks used for multi-channel connectors, the spacing is defined by spacers between layers or BGA ball thicknesses or solder past used in-between layers, where a ground plane in a multi-layer stacking configuration can be used to provide electrical cross talk between transformer and choke, or transformer and choke to transformer and choke. Since crosstalk rolls off as a square of the distance between traces this is easily maintained in the current invention. Improvements have occurred in 10-15 db isolation with every row of vias between the choke and transformer. This is beneficial within each channel for higher rejection and lower conversion of differential to common mode energy and vice versa. However, because of the tight coupling and minimized controlled leakage provided by the current invention, this via fence is rarely required in implementation.

Additionally, when stacking components it is not feasible to add infinite distance between top and bottom channels due to the height constraints of the connectors of adjacent component. The teardrop and closely space interwindings between primary and secondary turns minimizes leakage above and below the device and creates minimal impact on channel performance in the presence of components or shields.

Figure 1:
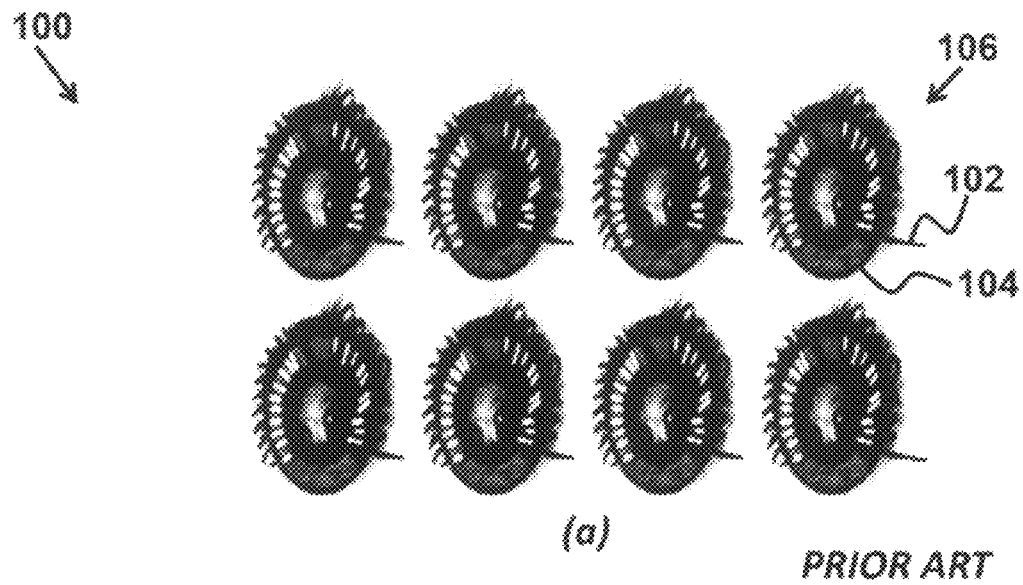
FIGS. 1(a)-(b) show prior art connectors created using hand-wound magnets that are integrated to the connector housing conventional soldering methods.
Figure 1:
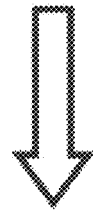
Figure 1:
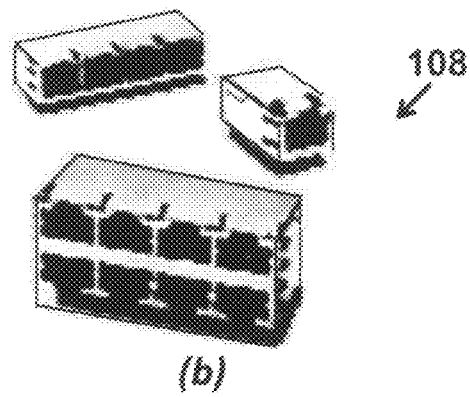

Integrated connectors consist of a jack similar to the RJ-45 as shown in FIG. 1(b), having a shell housing made of metal, plastic or PCB base and an integrated magnetic element. In today's integrated connectors these magnetic elements are simply ferrites hand wound with transformer copper wire. The wires are then soldered into the connector base to keep the magnetic from moving, a potting material is injected onto the ferrites after placement. This material has to be low stress such as a variation of silicone.

Figure 5:
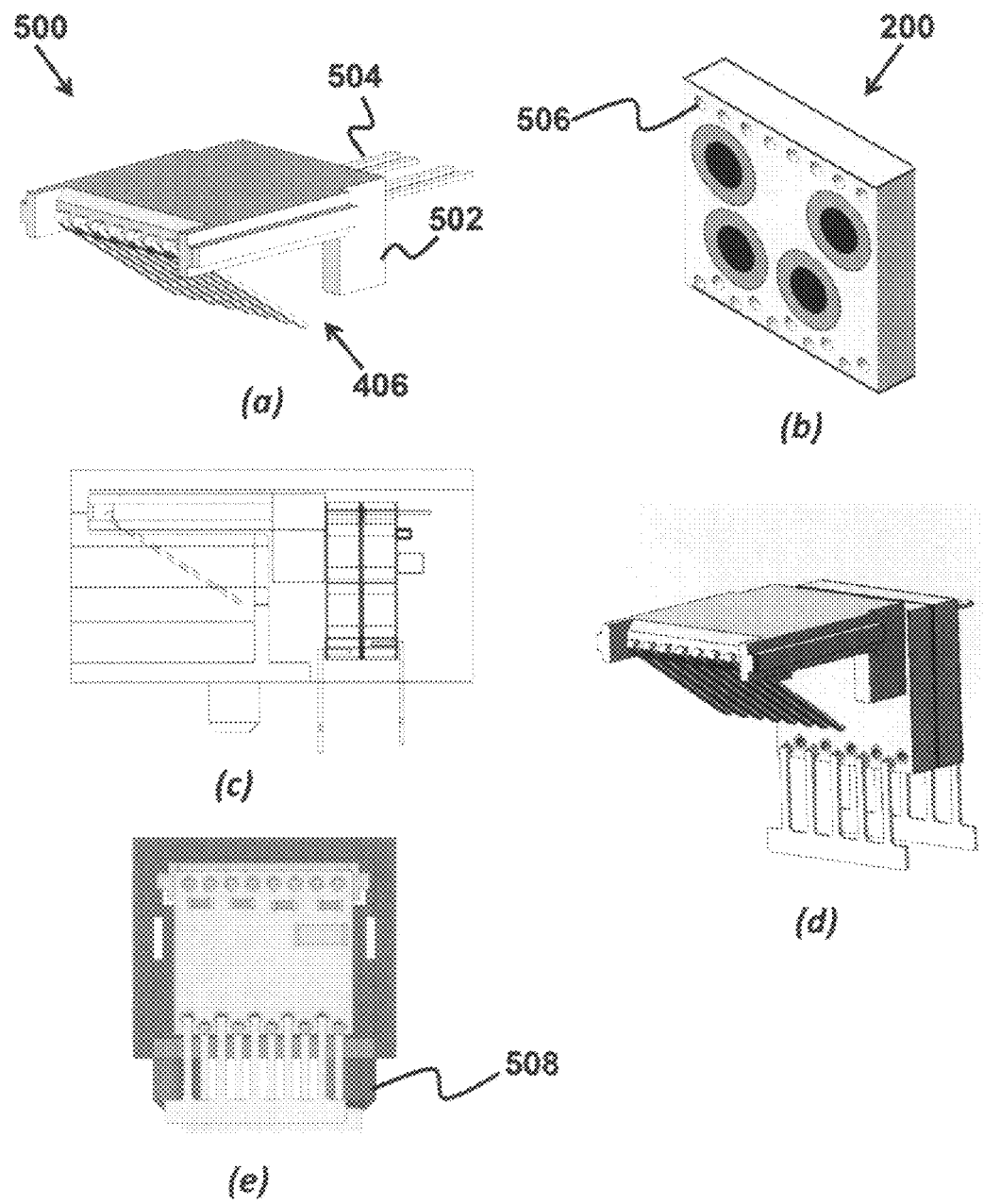
FIGS. 5(a)-(e) show the back of a jack mounted to the planar magnetics, where the conductors sliding into holes on the planar magnetics substrate, according to the present invention.
Figure 6:
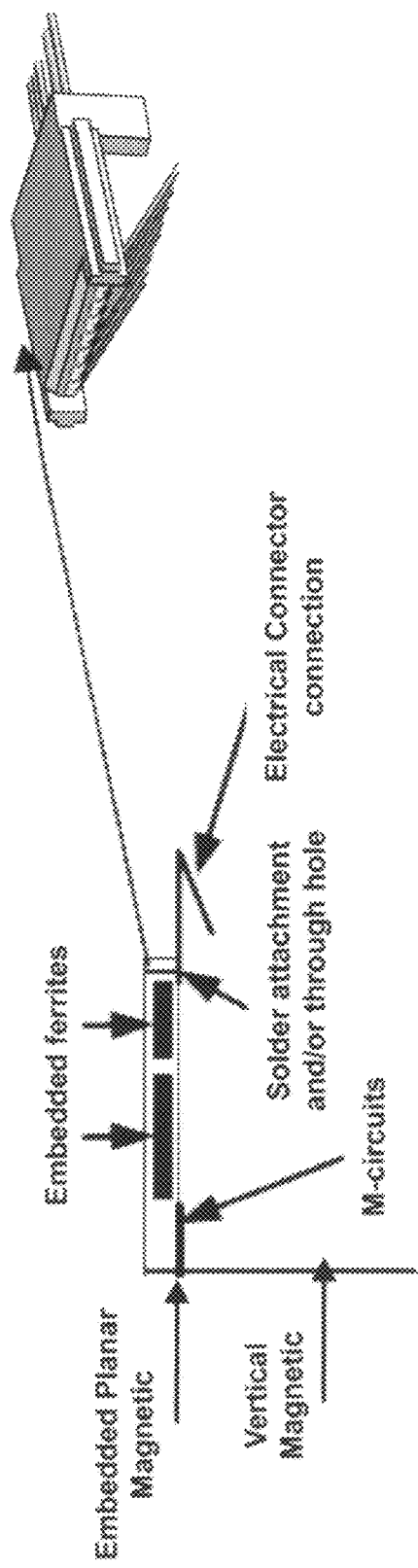
FIG. 6 shows a connector mounted to a PCB configured for connecting the planar magnetics to the PCB, where an additional header is added as shown in at the bottom of the device, according to the current invention.

FIGS. 5(a)-(e) planar magnetic inductors implemented with connectors 500. According to one aspect of the current invention, the back of the jack 502 is mounted to the planar magnetics 200. The interconnections in this implementation are the conductors 504 sliding into holes 506 on the planar magnetics substrate 202. If this implementation requires more than one layer of magnetic to account for multiple channels, additional magnetics layers can be added and interconnected through vias, solder pads or BGA balls. To connect to a PCB, an additional header 508 can be added as shown in at the bottom of the device in FIG. 5(e). By using thicker copper traces this connection to the board becomes a very efficient thermal channel to pull heat out of the connector. This is critical in powered connector applications such as PoE (Power over Ethernet). FIGS. 5(c)-(d) show what the side view and perspective view would look like in this implementation, respectively. In this case, the termination resistors and capacitors often used in these connectors would be mounted as shown in FIG. 5(e).

To create this unit, a base frame of plastic or metal would be used. The individual substrates would be slid vertically into place, preassembled with any needed passives for termination/filtering, or spacers needed to maintain crosstalk distances. The connector conductor assembly shown in FIGS. 5(a)-(e) can be inserted from front to back so that the conductors slide into the appropriate openings on the planar magnetic substrate. Solder or conductive epoxy can be used to attach the jack conductors to the vias in the substrates. Then this assembly can be reflowed to make the final attachment complete.

As an alternate embodiment of the current invention the planar magnetic may be used as a horizontal base. Rather than attaching the planar magnetic vertically and sliding the connector conductors into vias as in FIGS. 5(a)-(e), the conductors can be made longer and bent an additional 90 degrees so that they can contact a horizontal board. The planar substrates can then be stacked as before. However, this can extend the total connector length.

Figure 7:
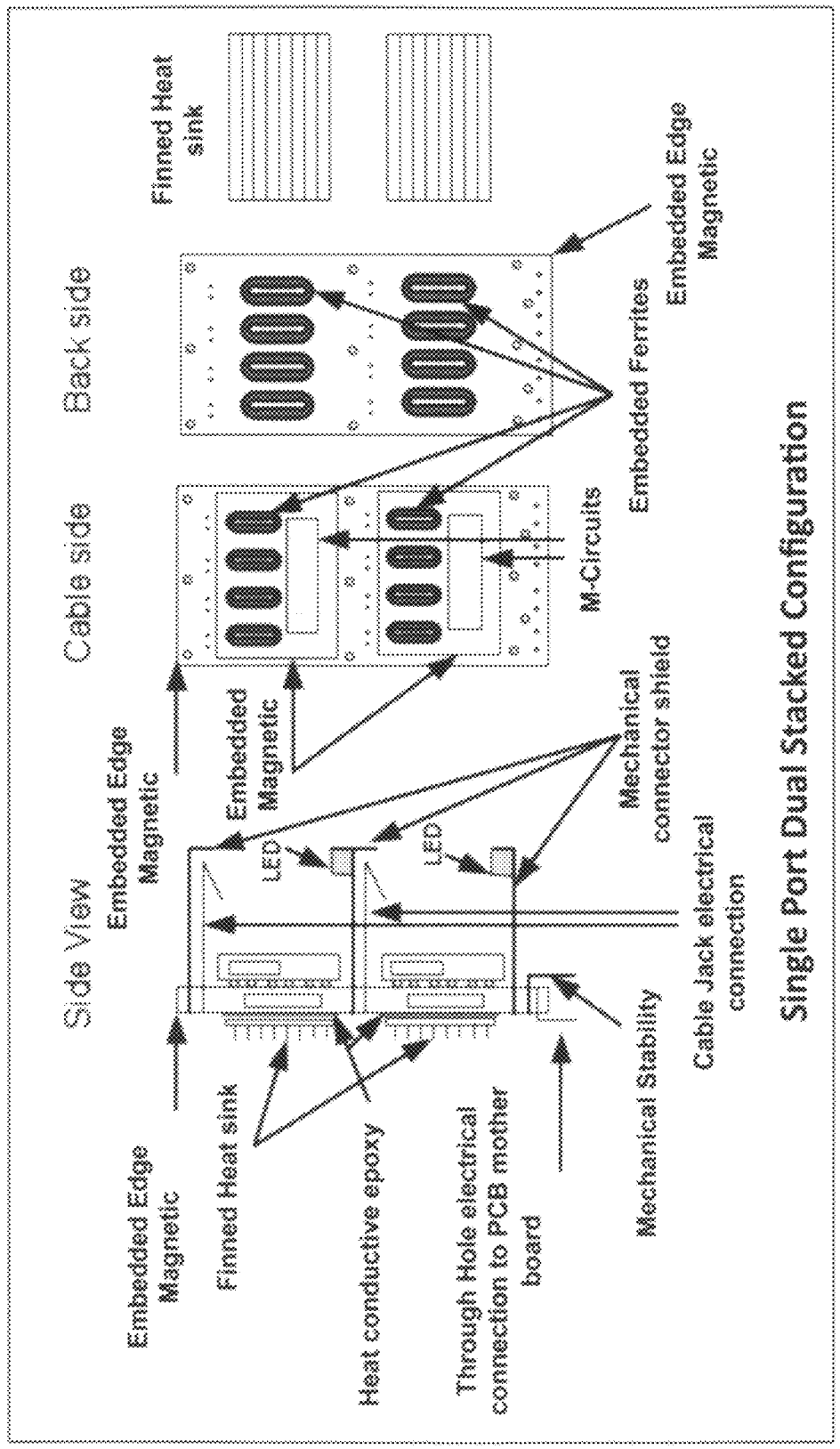
FIGS. 7-10 show various embodiments and aspects of the device and process of the current invention.

In a further embodiment, the conductor pins can be made only slightly longer and then bent on the ends. These ends can then be soldered flush with the horizontal board while they are held with the plastic insert, as shown in FIG. 7.

Figure 8:
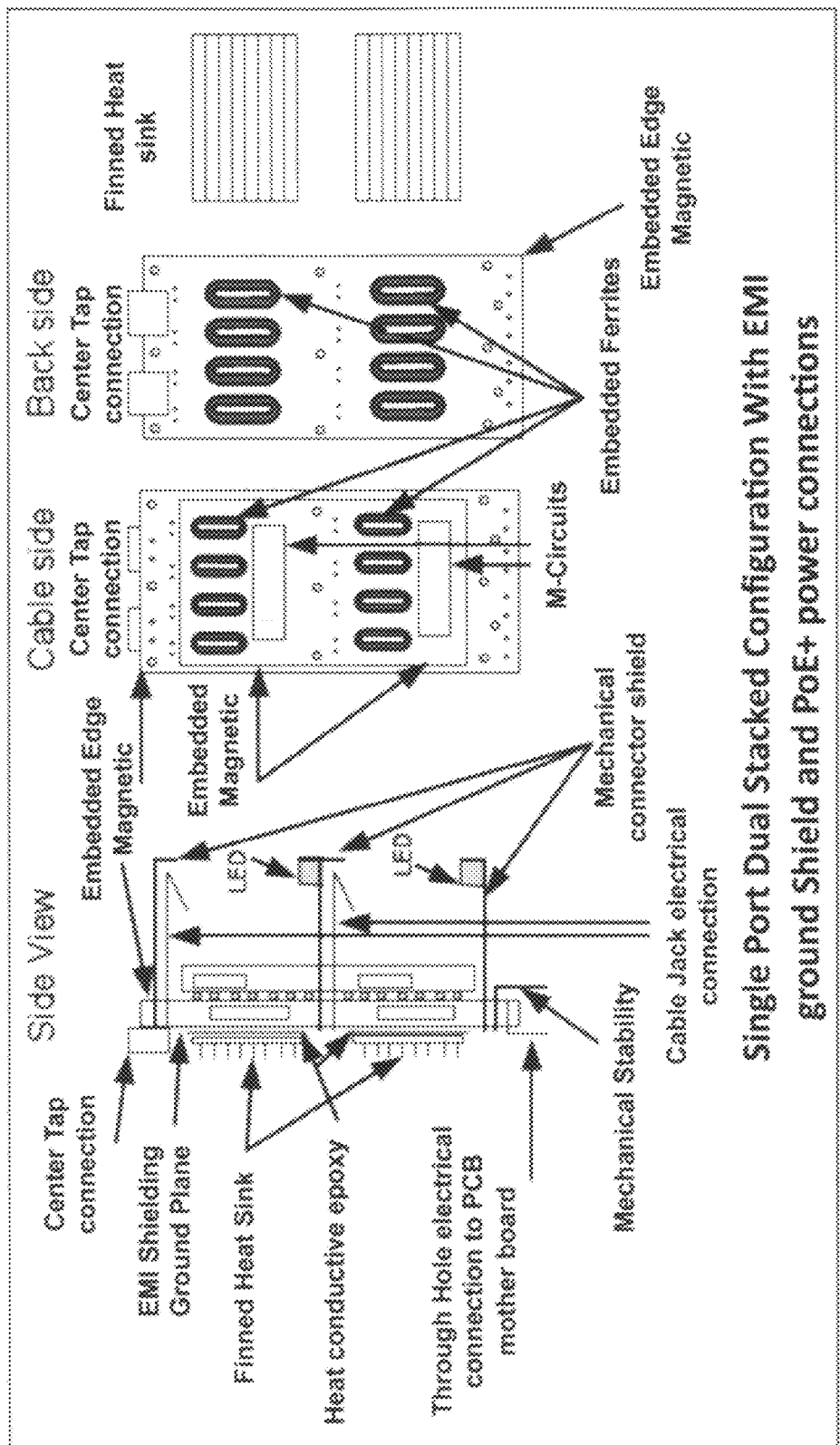
Figure 9:
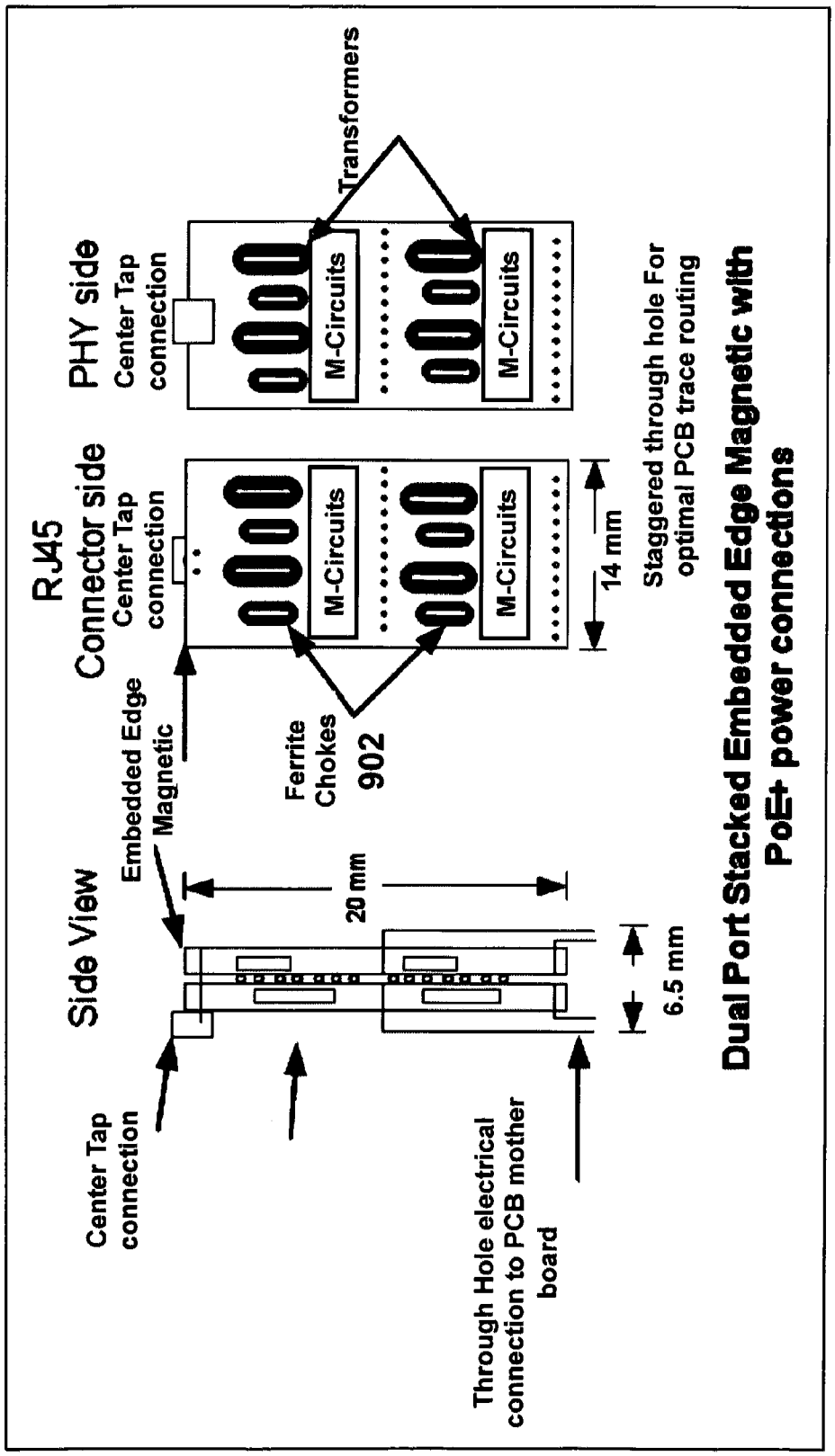
Figure 9:
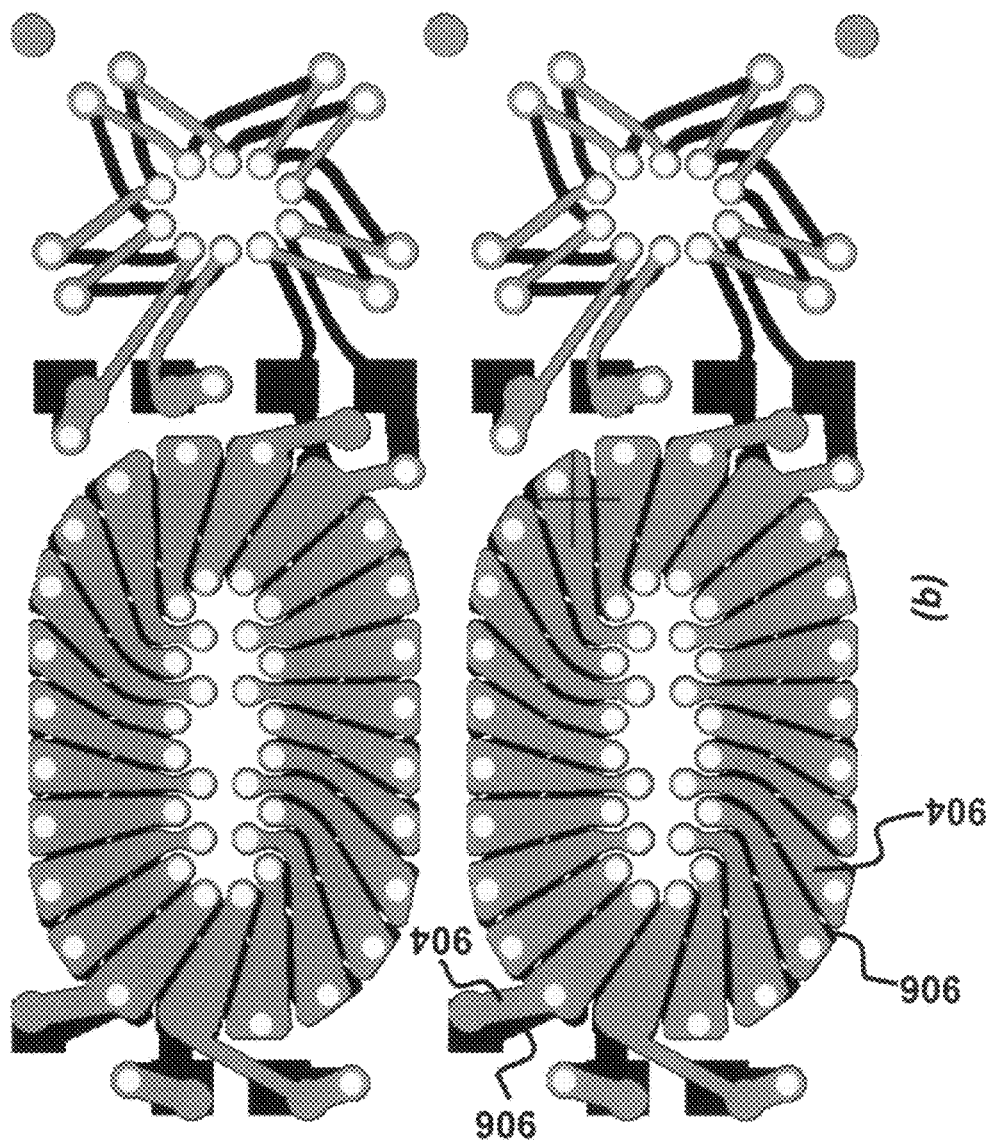
Figure 9:
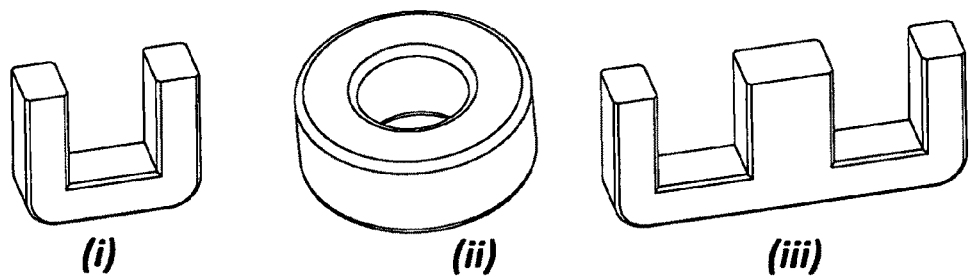
Figure 9:
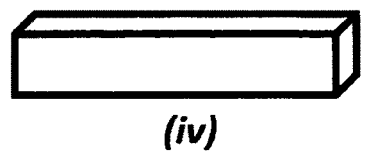
Figure 9:
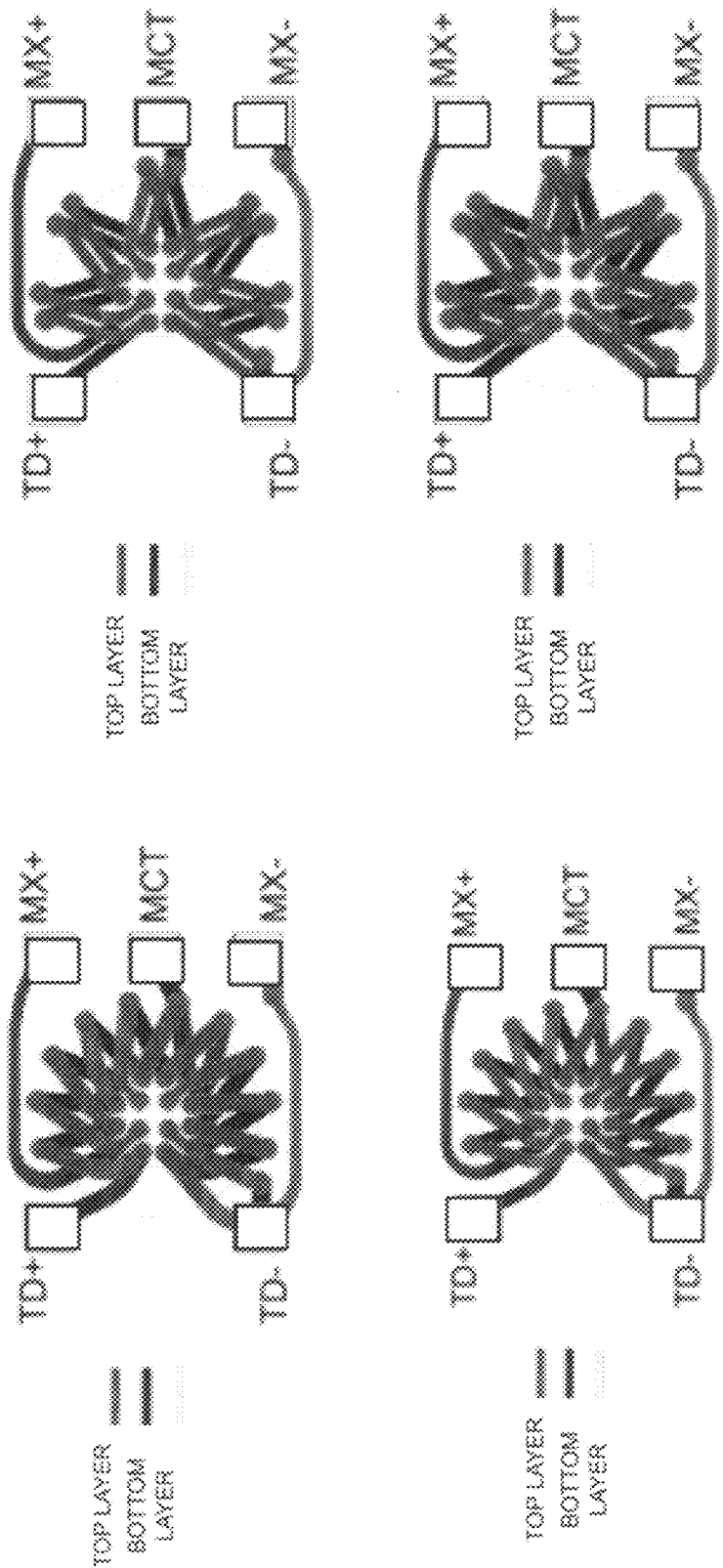
Figure 9:
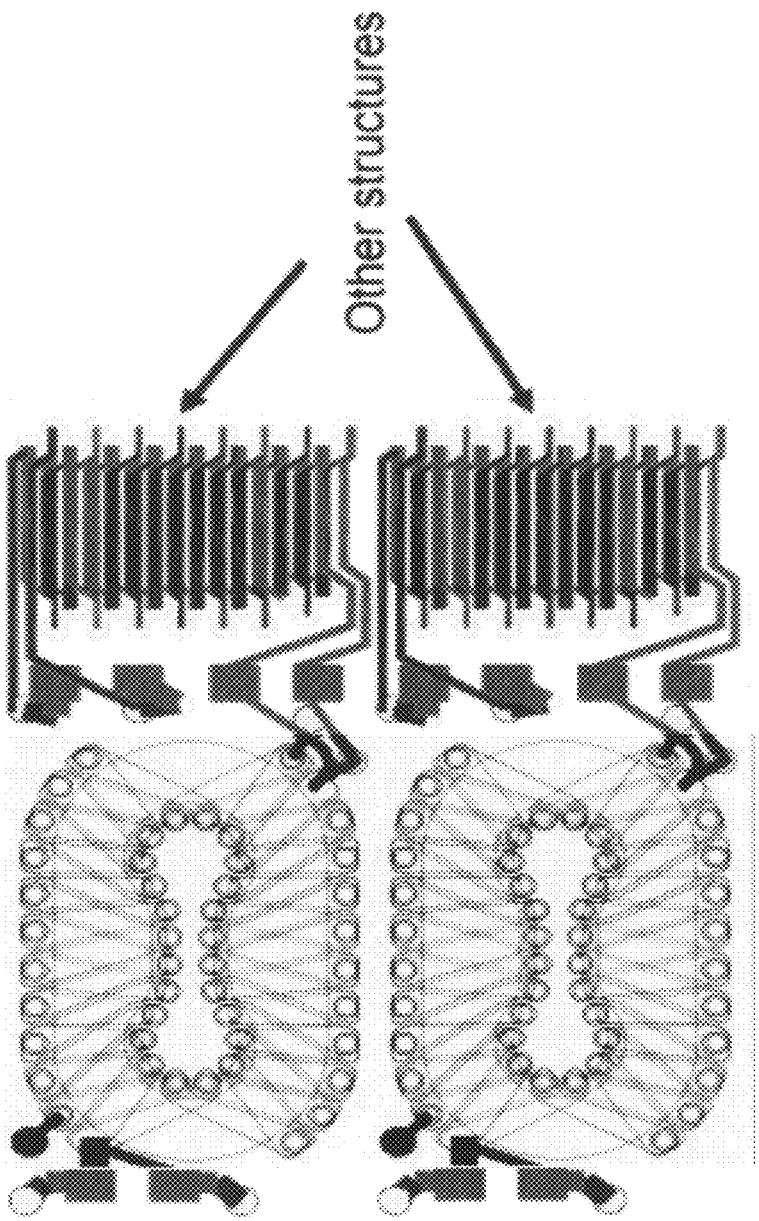

Additionally, the Embedded Edge magnetic module can be used as the electrical and mechanical base for creating integrated connectors. The Embedded Edge Magnetic device connects directly to the motherboard PCB with a socket or direct connect with through hole pins or other connection method with the Embedded Edge magnetic device being vertical or any where in between 1 to 179 degrees, as shown in FIGS. 7-9. FIG. 7 shows a single port dual height stacked configuration, FIG. 8 shows a single port dual height stacked configuration with EMI ground shield and PoE+ power connections, FIG. 9(a) shows a dual port stacked embedded edge magnet with PoE+ power connections. The stacked embedded planar magnetic portion can be in many different form factors relative to the main embedded edge module/substrate. The embedded edge magnetic module/substrate can be used in many configurations, such as 1×1, 1×2, 2×1, 1×4, 2×4 , 2×6 and so forth. In addition, the embedded edge magnetic module/substrate can reduce the width and height of connectors to create higher density switches within the industry standard 19" rack mountable systems. Also the embedded edge magnetics enables high power applications (PoE+) with an open back side allowing the heat generated from the magnetics to be transferred onto finned heat sink or other thermal conductive means where the system air flow can cross over and allow the heat to escape properly from the high density integrated embedded magnetic planar connector. The embedded edge magnetic module allows additional embedded planar magnetics to be stacked onto it to enable additional functionality and enables the small form factor configurations. This stacked embedded planar magnetics can incorporate common mode chokes for signal shaping and conditioning and M-Circuits. The M-Circuits are electrical circuitry supporting the embedded planar magnetics functionality for specific functions and applications. Examples of these M-Circuits include but are not limited to filter functions, cross talk cancelation functions, high voltage suppression and EMI suppression, digital controls, LED controls, Balun controls and power management functionality, etc . . . , such as the examples discussed in FIGS. 4c-4d. This M-Circuit can be implemented using discrete components, silicon die attachment (flip chip or wire bonding techniques) and other structures, which create electrical network functionality. FIG. 8 shows a configuration of the embedded edge module/substrate that enables optimal EMI shielding while allowing heat dissipation through a unique lamination process enabling electrical isolation with heat conductivity to support high power applications such as PoE+. In addition, thermal epoxy and other thermally conductive encapsulation materials can be used to help dissipate heat from around ferrites. The center tap connections allow optimal power distribution within a system that does not support power planes within the motherboard PCB, this is enabled by a power cable to the center tap connection on the top of the embedded edge module/substrate. The stacking combination can be as follows: transformer and choke on top of transformer and choke, filter and impedance matching on top of transformer and choke, or choke on top of filter, impedance matching and transformer. In FIG. 9(b) shows an example of the ferrite-based transformer 900 that is combined with a ferrite choke 902 where the top and bottom windings 904/906 of the choke 902 provide high level of common-mode to common mode attenuation. FIG. 9(c) shows some exemplary ferrite shapes that include annulus, toroid, a toroid with a dogbone-shape center wall, U-shape, E-shape or bar. When the termination schemes in FIGS. 4(c) and 4(d) are used, one can eliminate the need for a ferrite choke. Such an embodiment is shown in FIG. 9(e), where the non-ferrite choke provides common-to-common mode attenuation beyond 25 MHz.

The aforementioned descriptions cover transformers which are tightly coupled inductors with coupling coefficients higher than 0.9 and less than 1.0. This is what is required for a 1:1 transformer, where there is no impedance or voltage transformation. Another embodiment is M turns for primary and N turns for secondary to achieve M:N transformer. However, the coupling coefficient can be tailored by spacing the inductors or creating air gaps in the ferrite core to manipulate the coupling to be between 0 and 0.9. Another technique to decouple inductors is to use separate ferrites for each inductor. This allows inductors and transformers to be built as described in as embodiments are building blocks for many structures that can be combined to form components such as EMI filters, common mode chokes, directional couplers, Baluns and are not limited to these functions. These functionalities can be combined with the embedded planar magnetics to create system level functionality for applications such as Ethernet, set top boxes, RF routers, mobile interne, cellular and other electronic equipment requiring modules or subsystem functionalities. FIG. 9c (i)-c(iii) is an example of different shapes of ferrites that can be inserted in the baseboard to make such devices and components. The air span between different legs of the ferrite can be inserted with ground vias to alter the coupling between different sub-inductors. The primary description ahead discusses the use of annulus or toroid ferrites as they are most useful for Ethernet applications. In FIG. 9(d) an embodiment of a Balun is shown which is a three terminal device where one side of the primary is grounded. The energy coming out of the opposite end is split perfectly and opposite in phase. Baluns provide a single-ended input to a differential output or vice-versa to match impedance and is used in many RF applications.

The Embedded Edge Magnetic substrate/Module has a row of devices disposed vertical or slanted 45-degrees, or anywhere in between, inserted into the memory socket. The Embedded Edge Magnetic device has its own through-hole pins, which directly attach to the "motherboard" PCB. However, a similar configuration using a socket connector configuration similar to memory chips is also possible, or other attachment configurations that meet reliability requirements for vertical attachment. In addition to this basic configuration, specialized configurations are within the scope of the current invention, where socket or other connections can be put on the top edge for connecting center tap or other circuitry connections. The device can also be integrated into a connector where it provides the mechanical strength in mounting the entire connector to the mother board PCB. One aspect of the current invention enables applications such as 96 port high-density gigabit Ethernet switches, which cannot be achieved with conventional methods, and cost effective PoE+ Ethernet switches, thus minimizing motherboard PCB layers with proper power isolation with top edge connections.

The previous techniques for making electromagnetic components by hand winding copper wire around magnetic components have serious limitations with performance, repeatability, cost, and quality, where performance is determined by how consistently an individual can wrap copper wire loops around a magnetic component while working under a microscope using tweezers. For transformers made for the Ethernet market, this limits throughput to less than twenty parts per hour, per worker. Automated machinery to perform this work has not proven to be cost effective for the small form factor parts used in the communication industry. Previous attempts to resolve issues on how slabs of ferromagnetic material could be interjected in between layers of FR-4 (a type of low dielectric constant epoxy with embedded glass strands to provide rigidity) have had limited to no success because the types of ferromagnetic materials used are expensive, fragile, and highly sensitive to stress. They also do not provide any usable method for aligning the magnetic material in the embedded material which is needed to guarantee performance, repeatability and reliability. In order to get the needed levels of inductance this ferrite material must be adequately thick. Thinly deposited ferrite materials provide too low of levels of inductance. To create parts in this manner with the required levels of inductance would require ganging large numbers of individual components together, thus making the parts much too large in normal applications to fit behind a small connector. The ferrites used in normal transformers are formed by mechanical pressure into units much thicker. However, they are extremely brittle, where this material by its nature is highly sensitive to stress. The problem for embedding these materials is that epoxies used for PCB material are designed to be rigid to provide a base for additional layers of copper patterning and attached integrated circuits.

The current invention provides holes created through routing/drilling, punching or pre-formed in a planar substrate that is a rigid, fully-cured material, such as FR4, thermoset or thermoplastic, to provide openings for the magnetic components (Ferrites) they are made larger than the magnetic components (Ferrites) so that they can account for the normal manufacturing tolerances. Thermosets can be hydrocarbons filled with ceramic particles, which provide high glass transition temperature (Tg), low movement and coefficient of thermal expansion (CTE) matched to copper and the epoxy is used to encapsulate the ferrite. Once the magnetic pieces (Ferrites) are disposed in the openings they are surrounded/encapsulated with an epoxy and located precisely. The center hole of the magnetic pieces is filled with epoxy, plastic or other materials which are a plug to fill the hole. According to one aspect of the current invention, an interlayer of a low stress epoxy with fillers is used as an interface layer between the FR-4 base and the ferrite. A low stress epoxy is then provided, which serves to lock the ferrite in place while not placing stress on it over a temperature range found in the manufacturing process or found in operative use. According to one aspect, the interlayer is solid enough to allow drilling and vias to be plated through it. This requires a bisphenol, a resin base with added silica loaded to add stiffness to the mixture. Butadiene is added to provide a low stress environment for the ferrite. A critical piece of making the epoxy is adding each of the components while not allowing bubbles to form. This requires that the material is mixed together slowly and then placed in a vacuum to eliminate any bubbles prior to its use. It should be obvious that other adhesive materials that achieve the process steps described throughout this document could be used.

Figure 10:
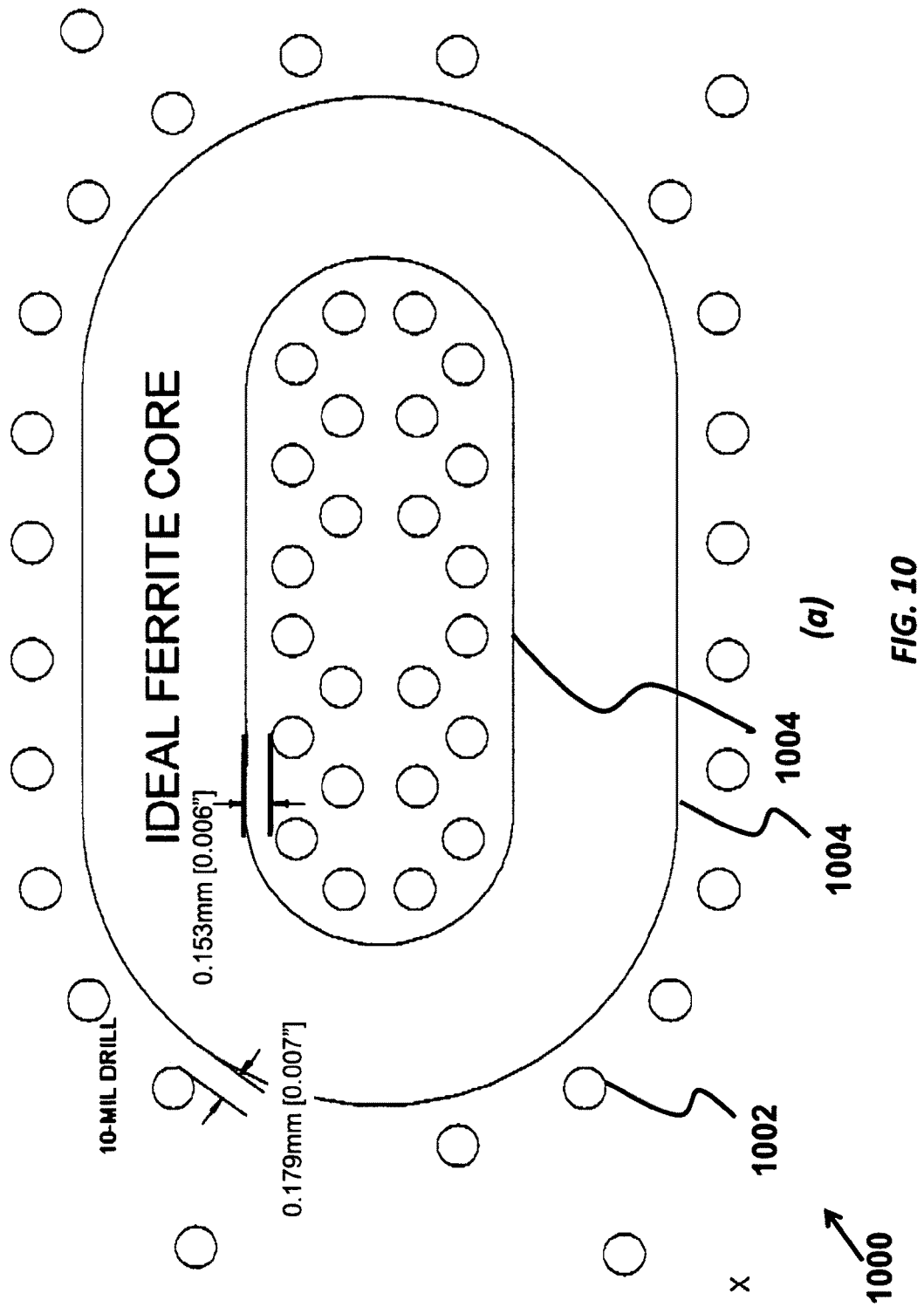
Figure 10:
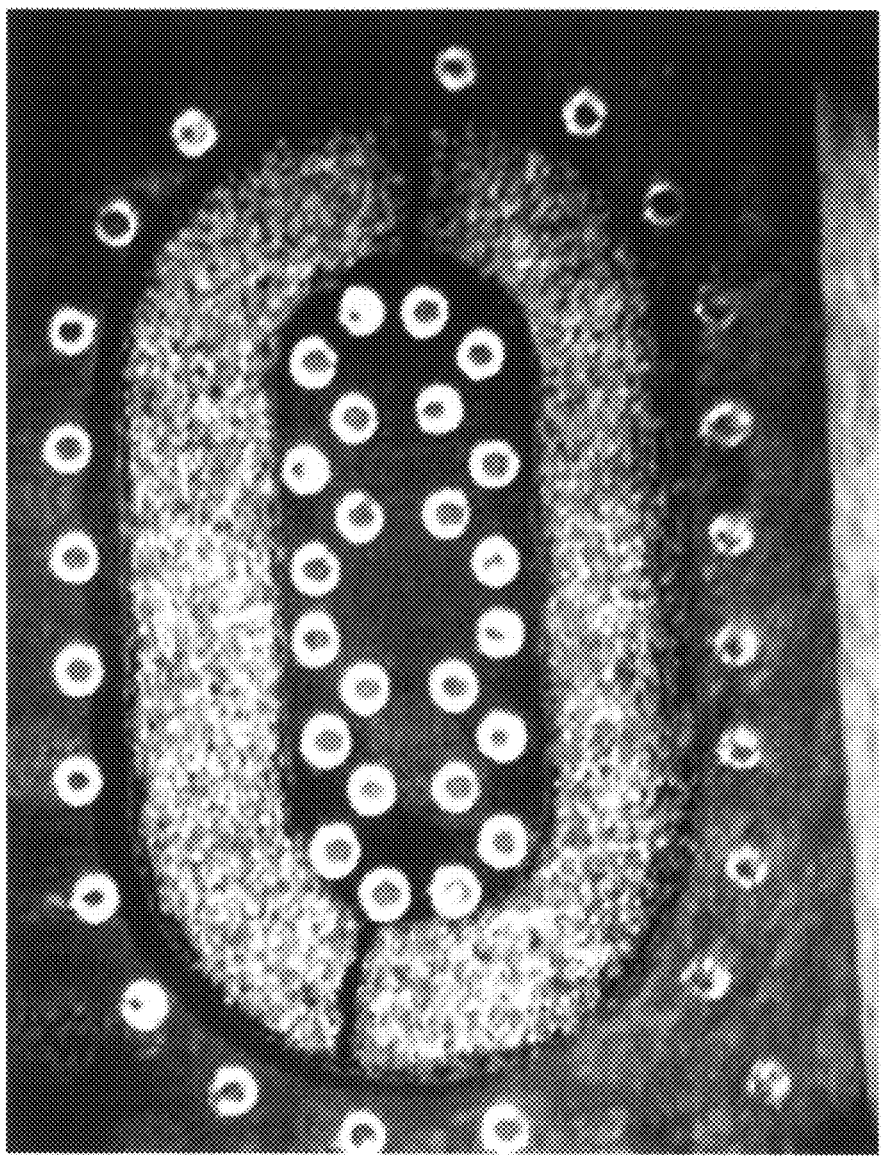

The current invention also provides a low stress method for further adding layers of simple copper above and below the base substrate, thus avoiding the detrimental effects of additional Fr-4 lamination on the magnetic components. This material is spread over uneven surfaces after the baseboard is completed, before copper is applied. The planar substrate is laminated with conductive materials using low stress epoxy, high temperature thermoplastics or high flow ceramic filled hydrocarbon materials on top and bottom. In order to create a part with consistent performance the magnetic components (Ferrites) must be placed accurately so that when via holes completing the windings are created they do not interfere or touch the ferrite. FIG. 10(a) shows a top view diagram of a relationship of holes and the ferrite 1000. As shown, ideally place holes 1002 are reasonably spaced from the ferrite wall 1004. A distance greater than 50 um is desirable. In the embodiment shown, the holes 1002 are 150 µm or 6 mils from the inner walls 1004. When the vias are too close to the ferrite, the ferrites will crack and cause degradation of inductance and performance. FIG. 10(b) shows such a cracked ferrite with improperly drilled vias that are too close to the ferrite. Any movement of the part after hole-placement could lead to ferrites being cracked during via drilling or performance variations; ferrite cracks or via "edging" where drilling is made into the ferrite material destroys the performance of the component. The planar substrate is laminated on top and bottom with conductive materials using low stress epoxy, high temperature thermoplastics (LCP) or high lateral flow ceramic filled hydrocarbon materials. FIG. 10(c) shows a top view of the layout of the top conductors 1006 connected to the conductive vias 1002 positioned inside and outside of the ferrite element 1004, as an exemplary arrangement.

Figure 11:
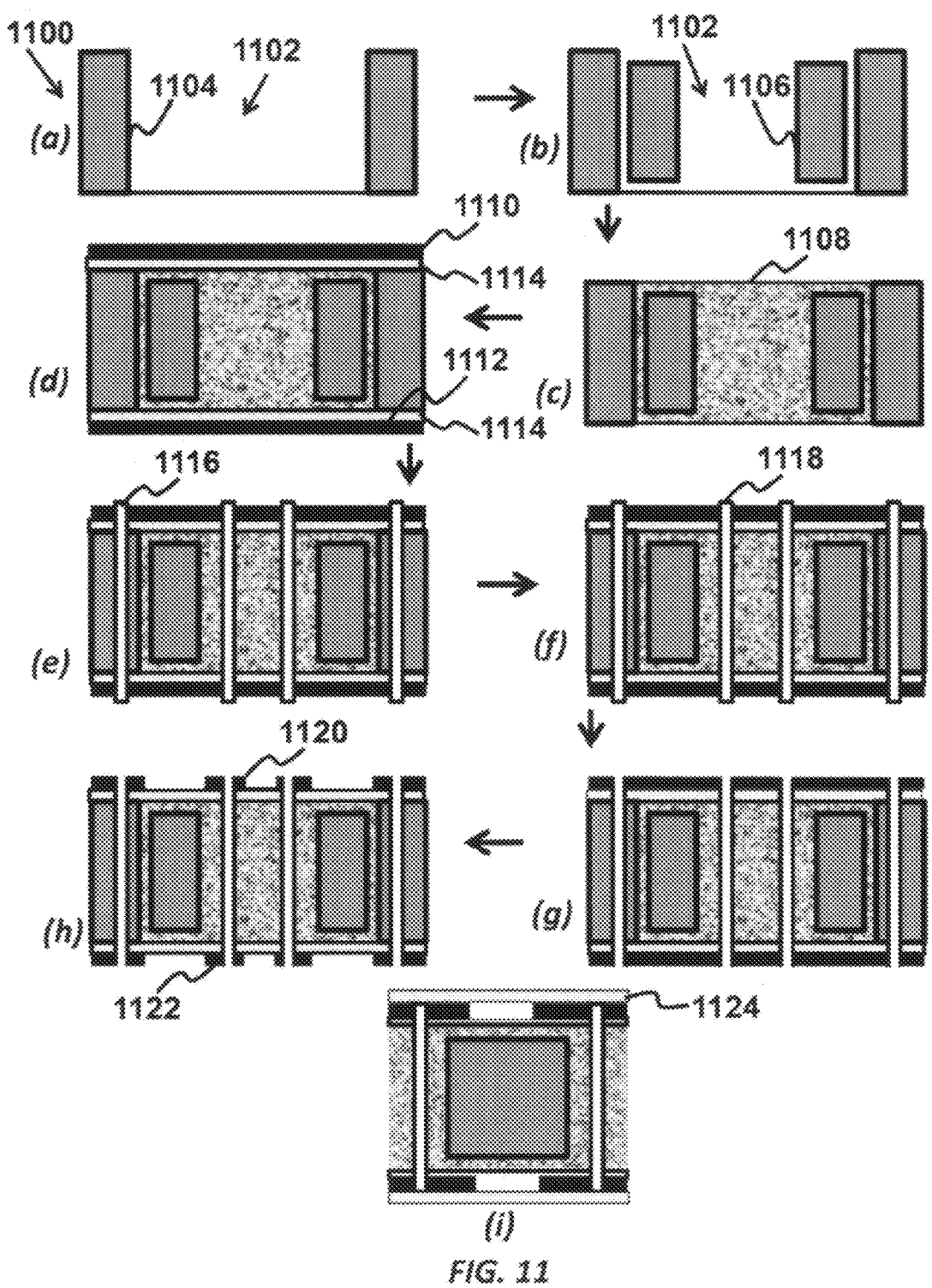
FIGS. 11(a)-(i) shows the steps for fabricating one embodiment of a planar magnetic structure according to the current invention.

FIGS. 11(a)-11(i) show process steps 1100 for fabricating a planar transformer 200 according to one aspect of the current invention. As shown in FIG. 11(a), a borehole 1102 is disposed in a fully-cured and rigid substrate 1104. FIG. 11(b) shows a ferrite material 1106 is disposed in the borehole 1102. The ferrite material is then enveloped in an elastic and non-conductive material 1108 as shown in FIG. 11(c). FIG. 11(d) shows a top conductor 1110 and a bottom conductor 1112 are bonded to the planar substrate 1104 surfaces using an insulating adhesive 1114. FIG. 11(e) shows through holes 1116 drilled through the top conductor 1110, the top bonding layer 1114, the elastic and non-conductive material 1108, the planar substrate 1104, the bottom bonding layer 1114, and the bottom conductor 1112, where the through holes 1116 are then cleaned. FIG. 11(f) shows the through holes 1112 are metal-coated to create conductive vias 1118. The conductive vias 1118 are then made even with the surfaces of the top and bottom of the conductive layers (1110/1112), as shown in FIG. 11(g). FIG. 11(h) shows top conductors 1120 and bottom conductors 1122 formed in the conductive layers (1110/1112) by etching from a lithographic mask or other comparable methods. FIG. 11(i) shows a cross section view of a completed wideband planar transformer 1100, where all of the external surfaces have been coated with an insulating layer 1124.

Additional layers may be added by laminating additional layers on top and bottom of the conductor layers (1110/1112) connected to each other using microvias. An example of high lateral flow ceramic filled hydrocarbon ceramic filled composite material is from Rogers Corporation called 4450F which is also ideal for adding additional layers of insulation and higher density routing. A planar substrate could also be prepared by laminating a sheet of 4450F or other such laminate with copper on one side to create a trough where ferrite and low stress epoxy can fit in. The constituents described later in low stress epoxy help alleviate lamination pressures from deterring performance of the ferrite.

An alternate method of the current invention allows the user to make use of an organic polymer base such as liquid crystal polymer (LCP), where holes have been premade and includes a post for the ferrite to reside on. The ferrite can be mechanically shaken into position making use of a tapered insert or placed with a pick and place machine. In this case, the LCP base and the post provide the supporting framework for the structure. An ultra low-stress material such as silicone can then be used to surround the ferrite since the vias are placed through the LCP. A thick layer of FR-4 can be laminated above the ferrite and then the entire process can proceed as in a standard PCB process as described above. When using LCP, this layer can be used as higher Tg than the planar substrate so that the flow is restricted when the material below it flows.

Figure 12:
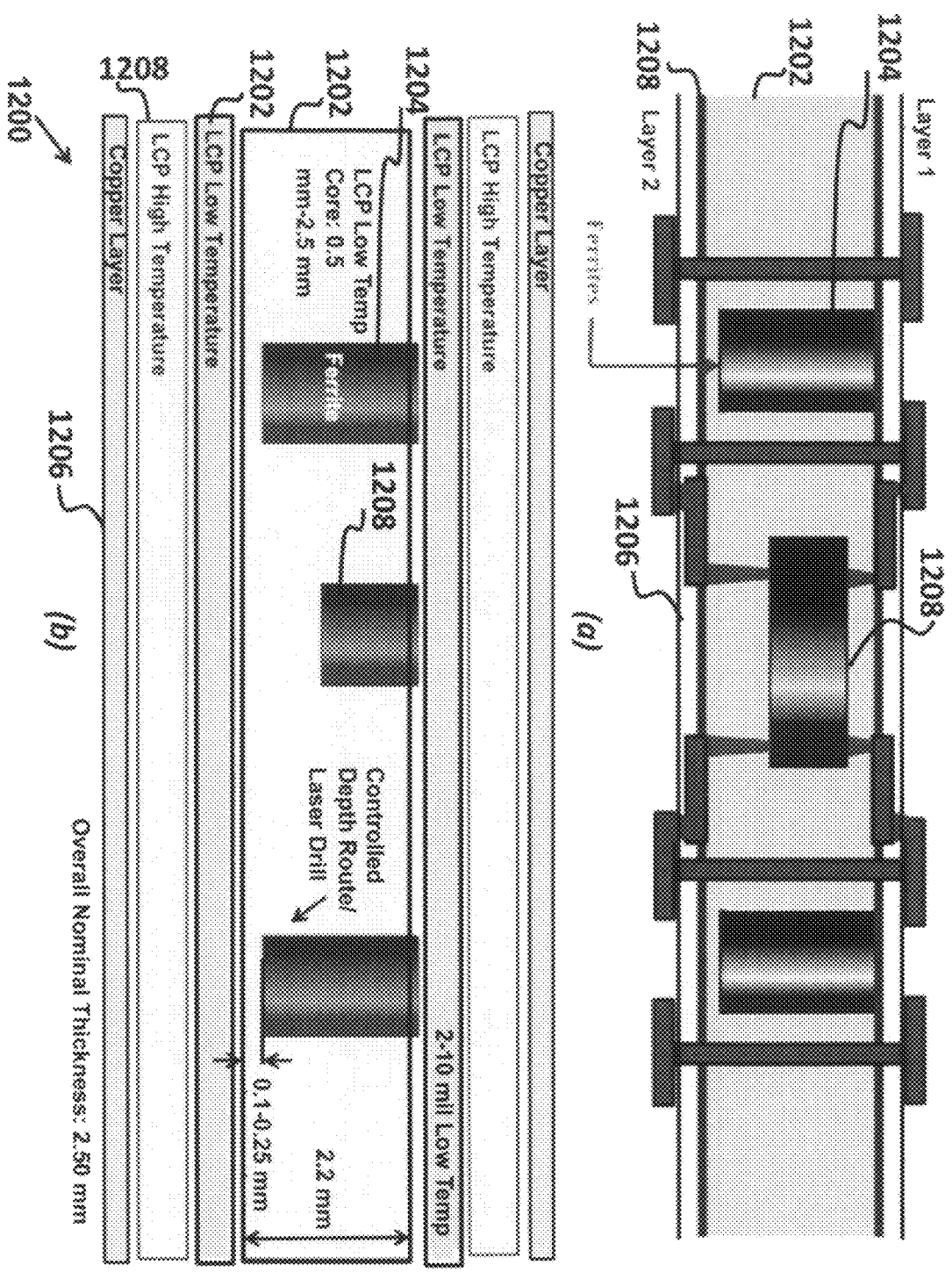
FIGS. 12(a)-(b) show use of a liquid crystal polymer (LCP) LCP as planar substrates and lamination layers according to the current invention.

Another construction 1200 using LCP as planar substrates and lamination layers is shown in FIGS. 12a-12b. Here the planar substrate 1202 could be controlled depth drilled as shown and the ferrites 1204 inserted, where for a low temperature liquid crystal polymer (LCP) 1202 the hole depth can be as low as 0.1 mm from the bottom. Thermoplastic materials like LCP can be used in molded-form or in circuit laminate-form. When using low temperature LCP as the planar substrate 1202, other materials described earlier can be eliminated and prevent non-homogenous interfaces; LCP can be taken to high temperature in the presence or absence of pressure to enable molding around the ferrite. In the center of the annulus or torroid ferrite 1204 one can insert a post the size of the inner hole made of LCP (see FIG. 14b and FIG. 16). Thermoplastic materials start flowing beyond their temperature of modulus (~180 degrees) and then reach high flow state at the glass transition temperature (Tg) typically 280-350 degrees. The higher temperature LCP 1208 or higher temperature thermoplastic is used to laminate and maintain rigidity while laminating copper 1206 on top and bottom. One can then use the process steps shown earlier to finish the via and trace formation on the LCP baseboard.

Additional copper layers 1206 may be added by using additional bonding materials with copper on top and bottom. Furthermore M-circuits 1208 in the form of discrete SMT, dies and package dies can be embedded in proximity to the ferrites 1204 using the same processes. FIG. 12(b) shows such circuits next to the ferrites. FIG. 12(a) shows connections made to these M-circuits 1208 using controlled depth drilled microvias. These vias can be formed using mechanical drills or laser drills. $CO_2$ lasers go specifically through soft materials such as epoxy and stop penetration at hard materials such as copper and solder pads.

Further, once the via holes are drilled, and ferrites placed, an additional layer of copper covered FR-4 or prepreg may be laminated on top of the layer used for supporting the ferrites, where this lamination process requires both pressure and heat to accomplish. In the process of this lamination the resin coated ferrites are destroyed. Without additional planarization, normal FR-4 does not provide enough liquid glue to cover the unevenness in the planar substrate. The additional lamination leaves open-air gaps, which will delaminate under normal reliability testing. It also does not adhere to the ferrite material causing reliability issues. The aforementioned techniques prevent planarity issues. Once the copper is attached a thick conformal solder mask, typically 2 layers of solder mask or special material for voltage protection, is required to improve the issues with breakdown voltage and vias may be fully plated. As noted in the prior art, the PCB process does not conform easily to the needed magnetic material without additional novel methods.

A critical requirement for parts operating as transformers is that they provide electrical isolation. Ethernet parts must be able to support 1500Vrms AC for a period of one minute. This is achieved by using a layer of solder mask or other material, which creates insulation for electric conductivity. Typically two layers of solder mask are required. In addition, it is critical to fill the vias with non-conductive materials.

Creating electromagnetic components requires large number of vias be placed around an irregular-shaped ferrite. This causes an uneven surface. These ridges and number of significant vias allow air gaps, which break down under high voltage stress. In addition, it is critical to ensure that any bubbles that exist in the epoxy or encapsulation materials be removed prior to curing process. Without additional techniques these parts will not pass the standards required for these types of components.

Figure 13:
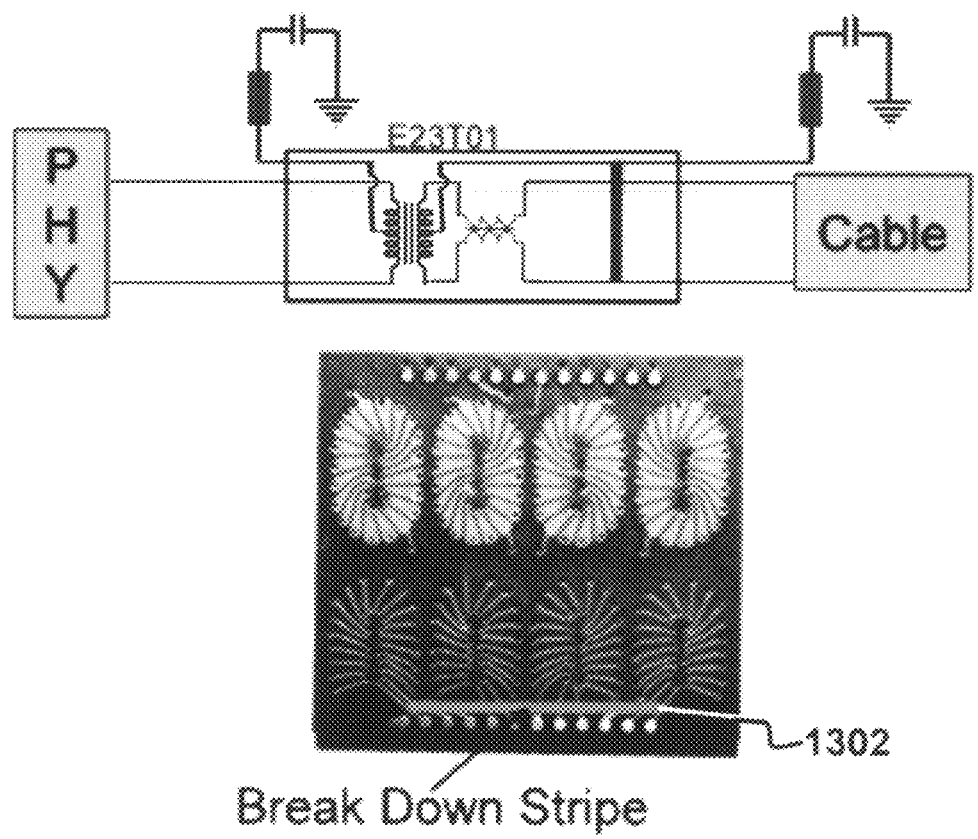
FIG. 13 shows a very high voltage capability for planar magnetic devices according to the current invention

FIG. 13 shows an implementation technique 1300 to create very high voltage capability for planar magnetic devices. The thin break down material 1302 layers can be used simultaneously to create parallel plate capacitors for decoupling DC blocking or filtering/matching applications and to create high voltage break down prior to circuitry that would break down at the 1500V rms. This configuration can provide support for break down voltage in a range of 500V rms to 10,000V rms depending on the material used between the circuitry. The placement of the break down material is critical. The FR4 or substrate material is routed or punched out and the break down material is floated in and cured prior to lamination process. Another embodiment of this is to open up pads in the PCB solder mask and deposit the break down material across the surface.

There exists a tradeoff between the size of the ferrite, the number of turns needed to get the required open circuit inductance, and the actual number of turns that can be achieved with certain shapes with closed loop magnetic paths. According to a further aspect, by focusing on the circumference, novel shapes that still have closed loop paths are created, and can have enough vias to maximize the inductance, where they can be made very narrow to facilitate the multiple channel parts (multiple ferrites per channel and multiple channels).

Figure 14:
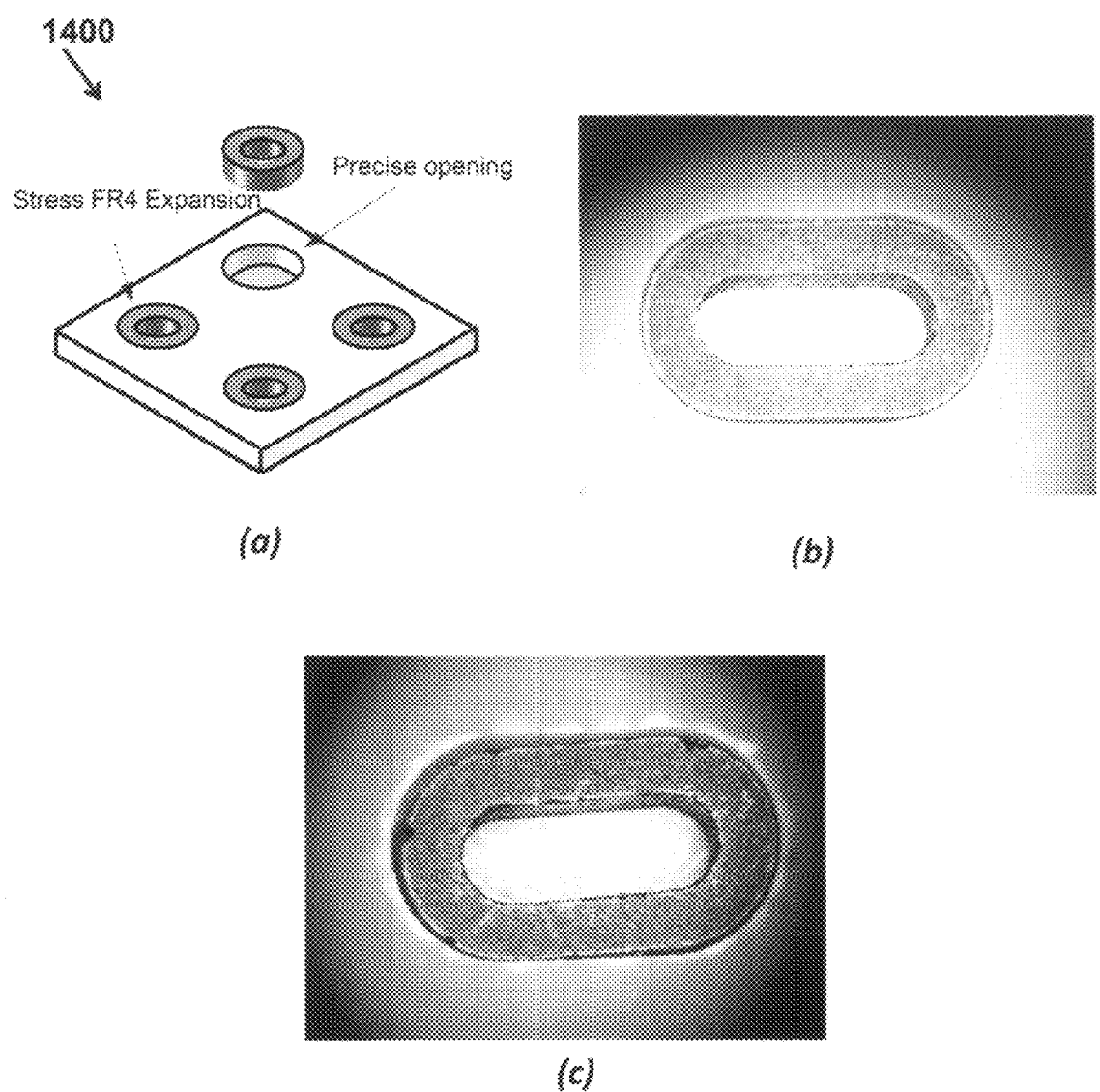
FIGS. 14(a)-(c) show that if precise openings are made in a base piece of Fr-4 for magnetic components, ferrites will see a high level of stress during thermal expansion such is seen in PCB infrared reflow operations according to the current invention.

Fr-4 is a common epoxy and glass composite used for PCB base materials has a coefficient of thermal expansion that is often 6-times as high as ferrite magnetic material. This means that if precise openings are made in a base piece of Fr-4 for magnetic components as shown in FIG. 14(a), ferrites will see a high level of stress during thermal expansion such is seen in PCB infrared reflow operations. Since ferrites are extremely brittle this leads to core cracking, destroying electromagnetic component performance. FIG. 14(b) shows an example of good alignment of ferrite to the hole-size. FIG. 14(c) shows an example of poor alignment of the hole-size to ferrite size. As an alternative, a larger opening may be made to provide a gap to accommodate manufacturing ferrite tolerances and stress issues, however, these leads to reliability problems from de-lamination caused by air gaps in the structure or improper structure alignment with the intended vias, eliminating one of the major benefits of creating parts in the method according to the current invention. An off the shelf epoxy used to fill this gap will causes undue stress on the ferrite due to the formation of high stress chains in the polymer. Low stress formulations like silicone do not provide a solid enough platform to drill and form vias in.

Figure 15:
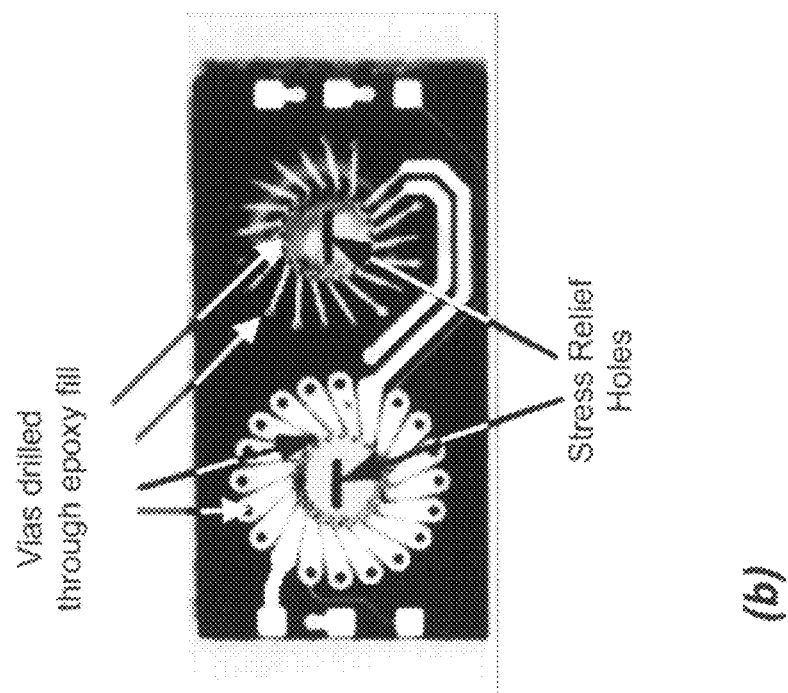
FIGS. 15(a)-(b) show a layer made up of a first low stress adhesive with additional rubberizing derivatives, much different from the base FR-4, absorbs much of the stress from the FR-4 expansion as a result of reflow, lamination and other pressure and temperature preccess and yet provides a stable base material for the drilling needed for vias according to the current invention.
Figure 15:
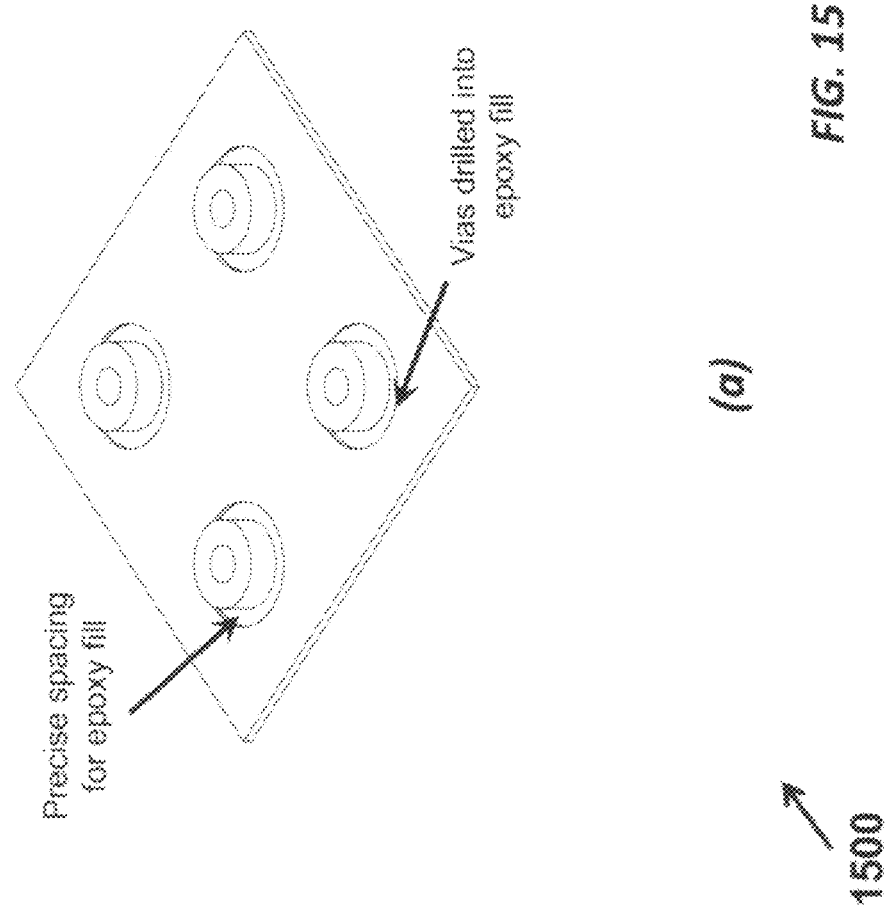

According to another aspect of the current invention, a low stress epoxy interface is provided between the FR-4 with the higher CTE, and the sensitive, brittle ferrite. This layer is made up of a first low stress adhesive, such as a low stress epoxy, with additional rubberizing derivatives, much different from the base FR-4. It provides for a much lower modulus of expansion so that when the temperature on the board is increased it becomes more rubber like and absorbs much of the stress being placed on it from the FR-4 expansion and yet provides a stable base material for the drilling needed for vias as seen in FIGS. 15(*a*)-(*b*), and it is still stiff enough to protect the via barrels and traces made on the material. This is critical to the ability to using a PCB base for supporting magnetic ferrites. Without this, no such development is possible.

Adhesive, such as Epoxy, can be dispensed in the ferrite openings first or may be dispensed after their placement, however, by placing the low stress material first and then allowing the ferrites to settle into the given opening, the parts tend to self-align so that the epoxy is even on all sides. Parts are allowed to settle and then semi-cure, thus, eliminating the alignment issues discussed above. Once the ferrites are locked in place further processing can be done by using alignment targets on the edge of the board, which are made prior to drilling ferrite openings. This allows standard PCB processing which is critical to completing a working electromagnetic component.

In some cases, stress relief holes or slots can be drilled into the center of the ferrite opening allowing the material to expand or contract with little issue. Also plastic or similar material can be use as a plug to fill the center hole in the ferrite.

In addition, a layer of the low stress epoxy with the addition of rubber derivatives can be used to attach copper layers to the top and bottom of the base Fr-4 holding the ferrites. This material may be applied through a number of simple processes such as screen printing or simple squeegee dispersal. It is critical that any bubbles be removed. This material acts to bind the copper to the FR-4 and to provide a conformal surface over the embedded ferrites without inducing the normal temperature and stress seen for FR-4 lamination. This is also critical to providing a flat surface to the solder mask later in the process, which is needed for voltage breakdown requirements.

Figure 16:
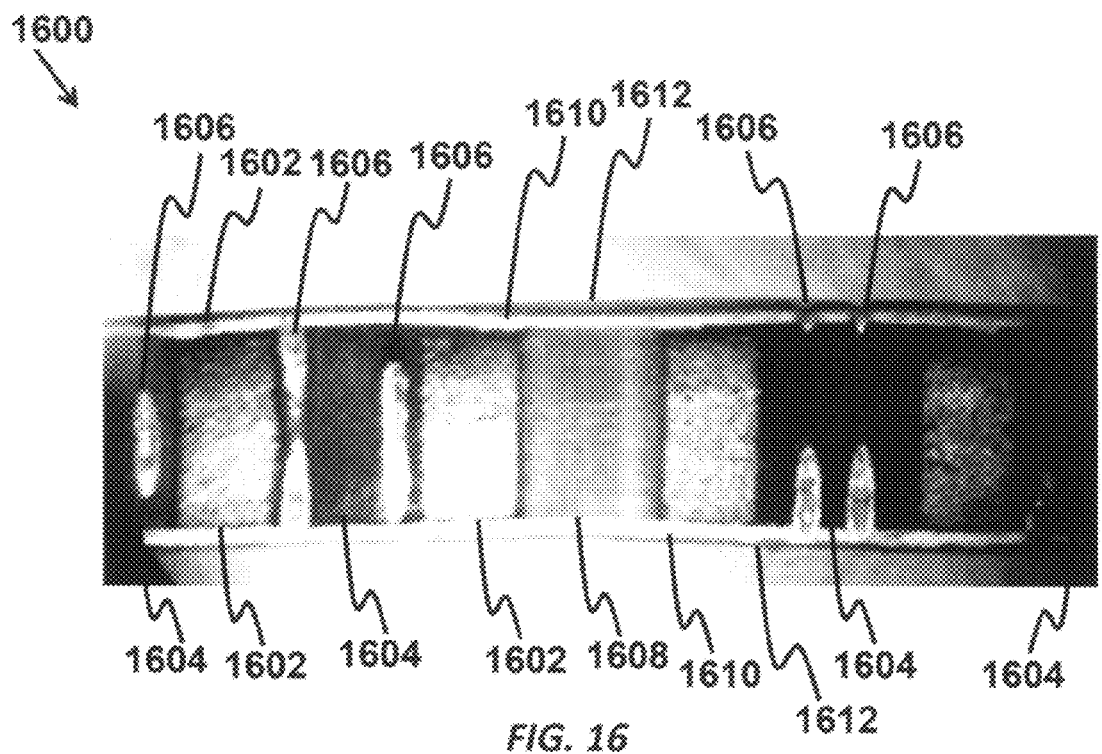
FIG. 16 shows a layer of the low stress epoxy, without the addition of rubber derivatives, used to adhere copper layers to the top and bottom of the base Fr-4 holding the ferrites according to the current invention.

FIG. 16 shows a cross section view of a planar transformer 1600, where the imbedded ferrite 1602 enveloped in the bonding laminate 1604, for example a special low-stress epoxy bonding laminate. Conductive vias 1606 are shown positioned on each side of the ferrite 1602. A portion of the fully-cured and rigid substrate 1608, for example FR4 or other rigid board material, is shown, and an insulating laminate 1610 is shown bonding a conductive layer 1612.

An additional method, according to the current invention, for helping planarize the board and to eliminate the issue with breakdown voltage is to fully plate the vias with copper or other materials. This eliminates the issue with high intensity fields causing breakdown ionization points if not covered in the via barrel and is much different than discussed in the prior artwork.

One novel way to address this is to create Ball Grid Area (BGA) pads on the top and bottom of the components. On the bottom, parts are designed with BGA pad layouts. These can be reflowed normally to attach to the customer printed circuit board. This eliminates much of the issue at higher frequencies since the fine pitch balls offer much lower inductance and resistance than normal wire leads used on traditional hand wound transformers.

In many applications the end product needed for use is a component of similar size to an integrated circuit in a plastic package. It is generally undesirable for a manufacturer to make use of a complicated PCB process for a component that may only take up 1% of the PCB. One aspect of the current invention is a device in an IC format that allows the manufacturer to continue to use his high volume process on large boards and utilize the advantages of processing units of the current invention in PCB format when needed. By slicing up the board into individual small units with BGA balls or pads similar to a Quad Flat No Leads package (QFN) or lead-less gate array (LGA) a dramatic improvement in the total solution is provided.

In one aspect of the invention, the process begins with a base material made of a dielectric, often FR-4, but for higher frequency parts this may be other materials. This material is manufactured in standard sizes and thicknesses and is delivered as a sheet. A manufacturer of embedded magnetic would begin by routing openings in the sheet that are larger than the ferrites to be used. These openings must be made large enough to maintain a gap between the ferrite and the FR-4, which accounts for any expansion seen during thermal cycling.

Once this opening is made, the board is placed tightly on a surface, which forms a bottom to the ferrite openings. Low stress epoxy with adhesion promoters, silica to add to the firmness of the material, and then butadiene to lower stress is added to each of the openings. A ferrite is placed by a standard pick and place machine, or with a mechanical shaker with an overlaid form with tapered guide holes. When allowed to settle into the epoxy the ferrites tend to self align so that epoxy material is evenly distributed around the ferrite. This is critical to making sure there are no air gaps in structure, which would lead to reliability failures, and properly placed which are needed to guarantee performance. A low temperature cure is used to lock the ferrite in place and to create a low stress polymer chain structure.

Once this board with ferrites in the epoxy is cured, additional thin layers of low stress epoxy are applied to the bases. This material set is the same as used to fill the ferrite openings except the softening material is left out. This material is evenly spread or pulled across the board either with a mechanical wiper or a screen-printing process. A layer of copper is then applied to the top surface. The board is placed in a vacuum box to extract any air bubbles that may be under the copper. This is repeated for the bottom layer of copper and then the boards are stacked and then cured with a higher temperature to lock in the low stress structure in the polymer.

Vias may be mechanically or laser drilled. In the case of mechanically drilled vias, care must be taken to avoid over heating the epoxy. This causes the epoxy to gum up and break up drill bits. Multi-step drill bit pecking is required to work its way through the material without breaking bits or leaving large amount of debris in the holes. Reformed epoxy debris can lead to improperly plated vias and reliability issues. UV laser drilling may also be used to create the via openings.

In some cases, the mass of the ferrite may make it sensitive to the expansion of the epoxy within its center. If an extended temperature range is needed some stress relief must be provided to allow the inner epoxy to expand without cracking the ferrite, or causing de-lamination of the PCB traces. This can be prevented by drilling additional dummy vias during the drilling process. These are blocked and not plated; however, when the device is exposed to temperature extremes this provides the epoxy room to expand.

Standard PCB processing can be used for the electro less plating, electroplating, and board patterning. However, to protect against breakdown voltage due to very high potential fields in a thin via barrel, these vias are completely filled. This also can be done with a conductive polymer. This leaves a solid top surface with no "valleys" for the wicking of solder mask. This spreads the field over a wider width of material and provides a flat surface for solder mask to be coated over with no air gaps. Once this is done a double layer of solder mask must be added to the board. This is used to protect against high voltage breakdown testing (hipot) and must be conformal with the board so that no air gaps are created which might breakdown under testing.

Silk screening parts allow the manufacturer to identify their parts to their customers. Additional real-time production information may be added to easily identify device information on the top of the part.

Once the boards are completed, complete performance testing (bed of nails in line testing) may be done on the entire board at once providing a good deal of cost savings. Parts can have solder balls attached. If a QFN package is utilized additional large vias are added to the drilling and plating process, which become castellations. The board can be routed to provide individual units. A myriad of possible solutions are available, as these units can be stacked, used horizontally or vertically, inserted into various mechanical enclosures or cable assemblies. In addition, simple pressure fit "snap in" configurations can be implemented. FIGS. 17(a)-17(c) show stacking options 1700, where solder balls 1702 are disposed on the bottom and top sides of the integrated planar transformer and electronic component 1704. FIG. 17(b) shows bottom pads 1706 and top pads 1708 on the integrated component 1704 disposed for stacking for, and FIG. 17(c) shows bottom pads 1706 on the integrated component 1704 for stacking to a to an integrated component 1704 with no pads as a top and insulated layer.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example using other laminate materials with higher dielectric constants in the range 2 to 1,000 from many manufactures such as 3M, DuPont and Rogers can be used as base boards or lamination materials. Variations in conductor materials can be used where copper could be replaced with aluminum, silver or gold for increased conductivity and reduced losses. Authors have not shown die attach techniques, which can be die attached, bump attach, wire bond. Other embodiments are ferrite holes are large enough that M-circuits could be embedded inside the ferrite cavity or ferrite materials. Applications such as antenna and other EMI gathering techniques can be implemented for energy harvesting and ultra-wide band.

All such variations are considered to be within the scope and spirit of the present invention as defined by the following claims and their legal equivalents.

What is claimed:
1. An integrated planar transformer and electronic component, comprising:
   a. at least one wideband planar transformer disposed in a planar substrate, wherein each said wideband planar transformer comprises:
      i. said planar substrate, wherein said planar substrate is in a fully-cured and rigid state;
      ii. a ferrite material, wherein said ferrite material is embedded in said fully-cured and rigid planar substrate, wherein said embedding comprises said ferrite material encased in an elastic and non-conductive material, wherein said elastic and non-conductive material comprises a low-stressing epoxy, wherein said low-stressing epoxy has a modulus of expansion that is lower than a modulus of expansion of said rigid planar substrate, wherein said low-stressing epoxy holds said ferrite material in place over a temperature range found in a manufacturing process or a temperature range found in operative use, wherein said ferrite is not stressed by said rigid planar substrate;
      iii. inter-wound conductors disposed around said embedded ferrite material, wherein said inter-wound conductors comprise top conductors bonded by a first bonding layer to a top surface of said fully-cured and rigid substrate and bottom conductors bonded by a second bonding layer to a bottom surface of said fully-cured and rigid substrate, wherein said bonding layers comprise an insulating adhesive, wherein said top and bottom conductors are connected in an interconnected pattern by conductive vias disposed on each side of said ferrite material, wherein said conductive vias span through said bonding layers and through said low-stressing epoxy and through said fully-cured and rigid planar substrate forming said inter-wound conductors;
      iv. at least one center tap connected to at least one said inter-wound conductor;
   b. at least one electronic component; and
   c. at least one terminal connected to said wideband planar transformer, wherein said electronic component is connected to said at least one terminal.

2. The integrated planar transformer and electronic component of claim 1, wherein said planar substrate is selected from the group consisting of FR4, thermoset and thermoplastic.

3. The integrated planar transformer and electronic component of claim 1, wherein adjacent said top conductors and said bottom conductors are disposed to conform to parallel and predetermined spacing there between and said adjacent top conductors and said bottom conductors are disposed to maximize a number of said windings around said embedded ferrite material to lower a winding parasitic inductance and leakage inductance.

4. The integrated planar transformer and electronic component of claim 3, wherein said spacing between said top conductors is in a range of 10 µm to 500 µm.

5. The integrated planar transformer and electronic component of claim 4, wherein said spacing between said conductors is filled with an electrical isolation material, wherein said electrical isolation material comprises soldermask or laminate materials.

6. The integrated planar transformer and electronic component of claim 1, wherein said conductive layers are laminated to said planar substrate using laminate materials selected from the group consisting of a flexible epoxy, high temperature thermoplastics, prepregs and high flow ceramic filled hydrocarbon.

7. The integrated planar transformer and electronic component of claim 1, wherein said center taps are impedance-matched to 50% of a differential impedance.

8. The integrated planar transformer and electronic component of claim 1, wherein said ferrite material has a shape selected from the group consisting of annulus, toroid, U-shape, E-shape and bar.

9. The integrated planar transformer and electronic component of claim 8, wherein a center of said annulus shape ferrite material or said toroid shape ferrite material comprise a dimensionally stable potting compound disposed therein.

10. The integrated planar transformer and electronic component of claim 8, wherein a center of said annulus shape ferrite material or said toroid shape ferrite material comprise a rigid thermoplastic substrate element or a rigid thermoset substrate element disposed therein, wherein said substrate element comprises material properties that match material properties of said planar substrate and a post-shape that matches a shape of said annulus center or a shape of said toroid center.

11. The integrated planar transformer and electronic component of claim 1, wherein a breakdown material is disposed across at least two terminals of said wideband planar transformer, wherein said breakdown material actuates when exposed to a potential in a range of 500V rms to 10,000V rms.

12. The integrated planar transformer and electronic component of claim 1, wherein all external surfaces of said integrated planar transformer are coated with an insulating layer, wherein at least one terminal of said integrated planar transformer is exposed.

13. The integrated planar transformer and electronic component of claim 1, wherein connections between said wideband planar transformer and said electronic component comprises at least one electrically conductive pin disposed through at least one hole in said substrate, wherein said at least one electrically conductive pin is linear or angled.

14. The integrated planar transformer and electronic component of claim 1, wherein said top conductors comprise a teardrop-shape, wherein a narrow end of said teardrop-shape is connected to an inner conductive element disposed in a center of an annulus-shaped or toroid-shaped of said ferrite material and a broad end of said teardrop-shape is connected to an outer conductive element disposed around an outside of said annulus-shaped or toroid-shaped said ferrite material.

15. The integrated planar transformer and electronic component of claim 14, wherein transformer inductors are coupled with a coupling coefficient between 0 to 1, wherein said coupling is according to i) a spacing between said conductive elements, or ii) a spacing between said teardrop-shape conductors, or iii) an open span in said annulus or said toroid ferrite, or iv) according to a ratio of primary and secondary said interwindings, or i), ii), iii) and iv), wherein said open span comprises an air gap, wherein said air gap may comprise at least one ground via.

16. The integrated planar transformer and electronic component of claim 1, wherein said electronic component comprises any connector requiring isolation or electromagnetic functionality.

17. The integrated planar transformer and electronic component of claim 16, wherein said connector comprises at least one electrical contact connected to at least one terminal of said planar transformer.

18. The integrated planar transformer and electronic component of claim 1, wherein said at least one wideband planar transformer comprises an array of said wideband planar transformers.

19. The integrated planar transformer and electronic component of claim 1, wherein said at least one electronic component comprises an array of connectors.

20. The integrated planar transformer and electronic component of claim 1, wherein said at least one electronic component comprises an array of magnetic modules.

21. The integrated planar transformer and electronic component of claim 1, wherein a bottom surface of said integrated planar transformer and electronic component comprises solder pads.

22. The integrated planar transformer and electronic component of claim 1, wherein thermal conduits are disposed to extract heat generated at said inter-wound conductors.

23. The integrated planar transformer and electronic component of claim 22, wherein said thermal conduits are selected from the group consisting of heat conductive metal plated vias, at least one heat conductive metal layer, additional heat conductive metal disposed on at least one signal trace, at least one heat conductive tab disposed at an edge of said integrated planar transformer device, and a heat conductive material around said edge of said integrated planar transformer and electronic component.

24. The integrated planar transformer and electronic component of claim 1, wherein said at least one center tap is disposed on top of said wideband planar transformer.

25. The integrated planar transformer and electronic component of claim 1, wherein said electronic component is disposed on top of said planar substrate to minimize a distance there between to providing a desired match for a center tap current.

26. The integrated planar transformer and electronic component of claim 1, wherein said wideband planar transformer further comprises i) at least one common mode choke, wherein each said common mode choke provides signal shaping and condition, or ii) M-circuits, or i) and ii), wherein said M-Circuits are electrical circuitry supporting functionalities of said embedded wideband planar transformer for specific functions and applications.

27. The integrated planar transformer and electronic component of claim 26, wherein said functionalities supported by said M-Circuits are selected from the group consisting of filter functions, cross talk cancelation functions, high voltage suppression, EMI suppression, digital controls, LED controls, Balun, and power management functionality.

28. The integrated planar transformer of claim 1, wherein said integration comprises stacking, wherein said stacking comprises at least a first said wideband planar transformer and first choke on top of a second said wideband planar transformer and a second choke and a filter and an impedance matching element on top of said first wideband planar transformer and said second wideband planar transformer and said first choke, wherein a number of said wideband planar transformers in said stack is according to desired application.

29. The integrated planar transformer and electronic component of claim 1, wherein said integration comprises stacking, wherein said stacking comprises an m-circuit disposed on an embedded ferrite, wherein said embedded ferrite is disposed on said wideband planar transformer.

30. The integrated planar transformer and electronic component of claim 1, wherein said integration comprises stacking, wherein said stacking comprises a choke on top of a filter, wherein said filter is disposed on top of an impedance matching element and said impedance matching element is disposed on said wideband planar transformer.

31. The integrated planar transformer and electronic component of claim 1, wherein said elastic and non-conductive material comprises at least one filler, wherein said elastic and non-conductive material with said filler have a coefficient of thermal expansion up to a coefficient of thermal expansion of said planar substrate.

32. The integrated planar transformer and electronic component of claim 1, wherein drill holes are provided in said substrate, wherein a thermal expansion of said integrated planar transformer and electronic component is controlled by said drilled holes.

33. The integrated planar transformer and electronic component of claim 1, wherein said at least one electronic component is mounted on top of said rigid substrate, on the bottom of said rigid substrate or embedded proximal to said wideband planar transformer.

34. The integrated planar transformer and electronic component of claim 1, wherein said substrate comprises alternating layers of high temperature liquid crystalline polymer (LCP)) and low temperature (LCP).

35. The integrated planar transformer and electronic component of claim 1 further comprises additional copper layers disposed on top of said substrates, wherein additional windings can be connected using microvias and plate through holes.

36. The integrated planar transformer and electronic component of claim 1 further comprises copper layers disposed on top of said substrates, wherein discrete components are embedded using controlled depth routing adjacent to said planar transformer within the body of said substrate using said flexible epoxy to encapsulate at least one discrete component, wherein connection to said at least one discrete component is made using micro-vias between said copper layer and a terminal of said at least one discrete component.

37. The integrated planar transformer and electronic component of claim 1 further comprises copper layers disposed on top of said substrates, wherein discrete components are embedded using controlled depth routing within a center ring of said planar transformer within the body of said substrate using said flexible epoxy to encapsulate at least one discrete component, and connection to said at least one discrete component is made using micro-vias between said copper layer and a terminal of said at least one discrete component.

38. The integrated planar transformer and electronic component of claim 1, wherein said low-stressing epoxy comprises the addition of rubber derivatives.

* * * * *